(12) United States Patent
Fukami et al.

(10) Patent No.: US 8,994,130 B2
(45) Date of Patent: Mar. 31, 2015

(54) MAGNETIC MEMORY ELEMENT AND MAGNETIC MEMORY

(75) Inventors: Shunsuke Fukami, Tokyo (JP);
Tetsuhiro Suzuki, Tokyo (JP);
Kiyokazu Nagahara, Tokyo (JP);
Nobuyuki Ishiwata, Tokyo (JP);
Norikazu Ohshima, Tokyo (JP)

(73) Assignee: NEC Corporation, Tokyo (JP)

( * ) Notice: Subject to any disclaimer, the term of this patent is extended or adjusted under 35 U.S.C. 154(b) by 667 days.

(21) Appl. No.: 13/145,082

(22) PCT Filed: Jan. 28, 2010

(86) PCT No.: PCT/JP2010/051098
§ 371 (c)(1),
(2), (4) Date: Aug. 24, 2011

(87) PCT Pub. No.: WO2010/087389
PCT Pub. Date: Aug. 5, 2010

(65) Prior Publication Data
US 2011/0297909 A1    Dec. 8, 2011

(30) Foreign Application Priority Data

Jan. 30, 2009 (JP) ................................. 2009-020138

(51) Int. Cl.
*H01L 27/22* (2006.01)
*G11C 11/16* (2006.01)
*H01L 43/08* (2006.01)

(52) U.S. Cl.
CPC .............. *G11C 11/16* (2013.01); *H01L 43/08* (2013.01); *H01L 27/228* (2013.01)
USPC ............ 257/421; 257/E29.323; 257/E21.665; 365/158; 365/173

(58) Field of Classification Search
None
See application file for complete search history.

(56) References Cited

U.S. PATENT DOCUMENTS 8,040,724 B2 * 10/2011 Suzuki et al. ............... 365/173
8,120,127 B2 * 2/2012 Nagahara et al. ........... 257/421
(Continued)

FOREIGN PATENT DOCUMENTS

JP    2005191032 A    7/2005
JP    2006073930 A    3/2006
(Continued)

OTHER PUBLICATIONS

International Search Report for PCT/JP2010/051098 mailed Mar. 9, 2010.
(Continued)

*Primary Examiner* — Matthew W Such
*Assistant Examiner* — Abul Kalam
(74) *Attorney, Agent, or Firm* — Sughrue Mion, PLLC

(57) ABSTRACT

A magnetic memory element includes: a first magnetization free layer formed of a ferromagnetic material having perpendicular magnetic anisotropy; a second magnetization free layer provided near the first magnetization free layer and formed of a ferromagnetic material having in-plane magnetic anisotropy; a reference layer formed of a ferromagnetic material having in-plane magnetic anisotropy; and a non-magnetic layer provided between the second magnetization free layer and the reference layer. The first magnetization free layer includes: a first magnetization fixed region of which magnetization is fixed, a second magnetization fixed region of which magnetization is fixed, and a magnetization free region which is connected to the first magnetization fixed region and the second magnetization fixed region, and of which magnetization can be switched. The second magnetization free layer is included in the first magnetization free layer in a plane parallel to a substrate. The second magnetization free layer is provided in a first direction away from the magnetization free region in the plane.

16 Claims, 19 Drawing Sheets

(56) References Cited

U.S. PATENT DOCUMENTS

| | | | |
|---|---|---|---|
| 8,159,872 B2* | 4/2012 | Fukami et al. | 365/173 |
| 8,363,461 B2* | 1/2013 | Suzuki et al. | 365/158 |
| 8,416,611 B2* | 4/2013 | Fukami et al. | 365/158 |
| 8,559,214 B2* | 10/2013 | Fukami et al. | 365/158 |
| 8,592,930 B2* | 11/2013 | Fukami et al. | 257/421 |
| 8,625,327 B2* | 1/2014 | Suzuki et al. | 365/148 |
| 8,687,414 B2* | 4/2014 | Nagahara et al. | 365/171 |
| 2010/0214826 A1* | 8/2010 | Fukami et al. | 365/158 |
| 2012/0278582 A1* | 11/2012 | Fukami et al. | 711/166 |
| 2013/0069626 A1* | 3/2013 | Zhou et al. | 324/76.39 |
| 2013/0175645 A1* | 7/2013 | Sugibayashi et al. | 257/421 |

FOREIGN PATENT DOCUMENTS

| | | |
|---|---|---|
| JP | 2006270069 A | 10/2006 |
| JP | 2007103663 A | 4/2007 |
| WO | 2007119446 A | 10/2007 |
| WO | 2008068967 A | 6/2008 |

OTHER PUBLICATIONS

N. Sakimura et al., "MRAM Cell Technology for Over 500-MHz SoC", IEEE Journal of Solid-State Circuits, vol. 42, No. 4, Apr. 2007, pp. 830-838.

A. Yamaguchi et al., "Real-Space Observation of Current-Driven Domain Wall Motion in Submicron Magnetic Wires", Physical Review Letters, vol. 92, No. 7, Feb. 20, 2004, pp. 077205-1-077205-4.

S. Fukami et al., "Micromagnetic analysis of current driven domain wall motion in nanostrips with perpendicular magnetic anisotropy", Journal of Applied Physics, vol. 103, 2008, pp. 07E718-1-07E718-3.

J. Hayakawa et al., "Effect of high annealing temperature on giant tuunel magnetoresistance ratio of CoFeB/MgO/CoFeB magnetic tunnel junctions", Applied Physics Letters, vol. 89, 2006; pp. 232510-1-232510-3.

T. Koyama et al., "Control of Domain Wall Position by Electrical Current in Structured Co/Ni Wire with Perpendicular Magnetic Anisotropy", Applied Physics Express, vol. 2008, pp. 101303-1-101303-3.

* cited by examiner

MAGNETIC MEMORY ELEMENT AND MAGNETIC MEMORY

TECHNICAL FIELD

The present invention relates to a magnetic memory element and magnetic memory. More particularly, the present invention relates to a magnetic memory element and magnetic memory using a domain wall motion.

BACKGROUND ART

A magnetic memory, especially a magnetic random access memory (MRAM) operates as a nonvolatile memory capable of a high-speed operation and rewriting an infinite number of times. Therefore, some types of MRAMs have been put into practical use, and some types of MRAMs have been developing to improve their general versatility. In the MRAM, a magnetic material is used as a memory element, and data is stored in the memory element as a magnetization direction of the memory element. Some methods for switching the magnetization direction of the memory element are proposed. Those methods have in common with usage of a current. To put a MRAM into practical use, it is important to reduce the writing current as much as possible.

According to the non-patent literature 1, it is required that the wiring current should be reduced to be equal to or less than 0.5 mA, preferably equal to or less than 0.2 mA. This is because the minimum layout can be applied to the 2T-1MTJ (Two transistors-One Magnetic tunnel junction) circuit configuration proposed in the non-patent literature 1 to realize the cost performance equal to or more than that of the existing volatile memory.

The most general method of writing data in a MRAM is to switch a magnetization direction of magnetic memory element by a magnetic field which is generated by passing a current through a wiring line for a writing operation prepared on the periphery of the magnetic memory element. Since this method uses a magnetization switching caused by the magnetic field, the MRAM can theoretically perform writing at a speed of 1 nano-second or less and thus, the MRAM is suitable for a high-speed MRAM. However, a magnetic field for switching magnetization of a magnetic material securing thermal stability and resistance against external disturbance magnetic field is generally a few dozens of [Oe]. In order to generate such magnetic field, a writing current of about a few mA is needed. In this case, a chip area is necessarily large and power consumed for writing increases. Therefore, this MRAM is not competitive with other kinds of random access memories. In addition, when a size of a memory cell is miniaturized, a writing current further increases and is not scaling, which is not preferable.

Recently, as methods to solving these problems, following two methods are proposed. The first method is a method using a spin transfer magnetization switching. This method uses a laminated layer including a first magnetic layer (magnetization free layer) which has magnetization that can be switched, and a second magnetic layer (reference layer) which is electrically connected to the first magnetic layer and has magnetization that is fixed. In the method, the magnetization in the first magnetic layer (magnetization free layer) is switched by using an interaction between spin-polarized conduction electrons and localized electrons in the first magnetic layer (magnetization free layer) when a current flows between the second magnetic layer (reference layer) and the first magnetic layer (magnetization free layer). A reading operation is carried out by using a magnetoresistive effect generated between the first magnetic layer (magnetization free layer) and the second magnetic layer (reference layer). Therefore, the MRAM using the spin transfer magnetization switching method is an element having two terminals.

The spin transfer magnetization switching is generated when a current density is equal to or more than a certain value. Accordingly, as the size of the element decreases, the writing current is also reduced. In other words, the spin transfer magnetization switching method is excellent in scaling performance. However, generally, an insulating film is provided between the first magnetic layer (magnetization free layer) and the second magnetic layer (reference layer) and a relatively large current should be made to flow through the insulating film in the writing operation. Thus, there are problems regarding resistance to writing and reliability. In addition, there is concern that a writing error occurs in the reading operation because a current path of the writing operation is the same as that of the reading operation. As mentioned above, although the spin transfer magnetization switching method is excellent in scaling performance, there are some obstacles to put it into practical use.

On the other hand, the second method, which is a magnetization switching method using a current induced domain wall motion effect, can solve the above-mentioned problems that the spin transfer magnetization switching method is confronted with. For example, a MRAM using the current induced domain wall motion effect is disclosed in the patent literature 1. That is, the patent literature 1 discloses a magnetic memory apparatus and a method of writing a magnetic data. The magnetic memory apparatus includes a magnetization fixed layer, a tunnel insulating layer, a magnetization free layer and a pair of magnetic data writing terminals. The magnetization fixed layer has fixed magnetization and conductive. The tunnel insulating layer is laminated on the magnetization fixed layer. The magnetization free layer includes a connection portion laminated on the magnetization fixed layer through the tunnel insulating layer, domain wall pinning portions formed at both ends of the connection portion, and a pair of magnetization fixed portions adjacent to the domain wall pinning portions and having fixed magnetization opposite to each other. The pair of magnetic data writing terminals is electrically connected to the pair of magnetization fixed portions, and makes a current flow through the connection portion, the pair of domain wall pinning portions and the pair of magnetization fixed portions of the magnetization free layer. In the first magnetic layer (magnetization free layer) having the magnetization which can be switched of the above MRAM using the current induced domain wall motion effect, generally, magnetization of both end portions are fixed such that the magnetization of one end portion is approximately anti-parallel to that of the other end portion. In the case of such magnetization arrangement, a domain wall is introduced into the first magnetic layer. Here, as reported in the non-patent literature 2, when a current flows through the domain wall, the domain wall moves in the direction same as the direction of the conduction electrons. Therefore, the data writing can be realized by making the current flow inside the first magnetic layer (magnetization free layer). The data reading is realized by using the magnetoresistive effect caused by a magnetic tunnel junction provided in a region where the domain wall moves. Therefore, the MRAM using the current induced domain wall motion method is an element having three terminals, and fits in the 2T-1MTJ configuration proposed in the above-mentioned non-patent literature 1.

The current induced domain wall motion is generated when the current density is equal to or more than a certain value. Thus, this MRAM has the scaling property similar to the MRAM using the spin transfer magnetization switching. In addition, in the MRAM element using the current induced domain wall motion, the writing current does not flow through the insulating layer in the magnetic tunnel junction and the current path of the writing operation is different from that of the reading operation. Consequently, the above-mentioned problems caused in the spin transfer magnetization switching can be solved.

However, in the non-patent literature 2, a current density of approximately $1 \times 10^8$ A/cm² is required for the current induced driven domain wall motion. For example, it is assumed that a width and a thickness of a layer where the domain wall motion arises are 100 nm and 10 nm, respectively. In this case, the writing current is 1 mA. This cannot satisfy the above-described condition for the writing current. However, as described in the non-patent literature 3, it is reported that, by using a material having perpendicular magnetic anisotropy as a ferromagnetic layer (magnetization free layer) where the current induced domain wall motion arises, the writing current can be sufficiently reduced. Because of this, in the case of manufacturing an MRAM using the current induced domain wall motion, it is preferable to use a ferromagnetic material having perpendicular magnetic anisotropy as a layer (magnetization free layer) where the domain wall motion arises.

As a related technique, the patent literature 2 discloses a varying method of a magnetization state of magnetoresistive effect element using a domain wall motion, a magnetic memory element and a solid magnetic memory using the method. The magnetic memory element includes a first magnetic layer, an interlayer and a second magnetic layer. The magnetic memory element records data as magnetization directions of the first and second magnetic layers. The magnetic memory element records data by forming regularly magnetic domains with mutual anti-parallel magnetizations and a domain wall separating those magnetic domains in at least one of the magnetic layers and moving the domain wall in the magnetic layer so as to control positions of the adjacent two magnetic domains.

The patent literature 3 discloses a magnetoresistive effect element based on a domain wall motion using a pulse current and a high-speed magnetic recording device. This magnetoresistive effect element includes a first magnetization fixed layer/a magnetization free layer/a second magnetization fixed layer. The magnetoresistive effect element includes a mechanism for inducing a domain wall generation in a transition region between the magnetization fixed layer and magnetization free layer, the transition region being at least one of a boundary between the first magnetization fixed layer/the magnetization free layer and a boundary between the magnetization free layer/the second magnetization fixed layer. The magnetization directions of these magnetization fixed layers are set to approximately anti-parallel magnetizations. The domain wall exists one of the transition regions between the first magnetization fixed layer/the magnetization free layer and between the second magnetization fixed layer/the magnetization free layer. By applying a current less than $10^6$ A/cm² with a certain pulse width, the domain wall moves between two transition regions, thereby making the magnetization of the magnetization free layer switch and detecting the magnetoresistive value caused by the switching of the relative magnetization direction.

CITATION LIST

Patent Literature

Patent Literature 1: JP2005-191032A
Patent Literature 2: JP2006-73930A
Patent Literature 3: JP2006-270069A Non Patent Literature Non Patent Literature 1: IEEE JOURNAL OF SOLID-STATE CIRCUITS, Vol. 42, p. 830 (2007).
Non Patent Literature 2: Physical Review Letters, Vol. 92, p. 077205 (2004).
Non Patent Literature 3: J. Appl. Phys. Vol. 103, p. 07E718 (2008).
Non Patent Literature 4: Applied Physics Letters, vol. 89, p. 232510 (2006).
Non Patent Literature 5: Applied Physics Express, vol. 1, p. 101303 (2008).

SUMMARY OF INVENTION

As disclosed in the patent literature 1, in the domain wall motion MRAM, the MTJ for data reading is provided adjacent to the region where the domain wall motion arises. Here, the MTJ includes the magnetization free layer where the magnetization can be switched, a non-magnetic layer and a reference layer. In the case of manufacturing the domain wall motion MRAM using a ferromagnetic material having perpendicular magnetic anisotropy as the magnetization free layer, the reference layer is also required to be formed of a ferromagnetic material having perpendicular magnetic anisotropy. That is, the MTJ is a perpendicular magnetization MTJ.

Recently, as reported in the non-patent literature 4, a huge TMR ratio over 500% can be obtained in an in-plane magnetization MTJ. On the other hand, there is no report that such a huge TMR ratio can be obtained in a perpendicular magnetization MTJ. The TMR ratio corresponds to the magnitude of the data reading signal in the MRAM, and the TMR ratio is preferably large as much as possible for the high-speed operation. Therefore, in the MRAM for the high-speed reading, it is desired to use the in-plane magnetization MTJ.

Further, generally, the more a cell area of an MRAM decreases, the more a bit cost will is reduced, which leads to costs reduction. In the above-described 2T-1MTJ configuration, the cell area can be reduced up to 12 F² at the minimum. The domain wall motion MRAM is also in the similar situation and preferably has the configuration with the cell area of 12 F².

Therefore, an object of the present invention is to provide a magnetic memory element and magnetic memory using a domain wall motion, in which a writing current is small, a reading signal is large, and a cell size is small.

A magnetic memory element according to the present invention includes: a first magnetization free layer, a second magnetization free layer, a reference layer and a non-magnetic layer. The first magnetization free layer is formed of a ferromagnetic material having perpendicular magnetic anisotropy. The second magnetization free layer is provided near the first magnetization free layer and formed of a ferromagnetic material having in-plane magnetic anisotropy. The reference layer is formed of a ferromagnetic material having in-plane magnetic anisotropy. The non-magnetic layer is provided between the second magnetization free layer and the reference layer. The first magnetization free layer includes a first magnetization fixed region, a second magnetization fixed region and a magnetization free region. Magnetization of the first magnetization fixed region is fixed. Magnetization of the second magnetization fixed region is fixed. The magnetization tree region is connected to the first magnetization fixed region and the second magnetization fixed region and magnetization of the magnetization free region can be switched. The second magnetization free layer is included in the first magnetization free layer in a plane parallel to a substrate. The second magnetization free layer is provided in a first direction away from the magnetization free region in the plane.

A magnetic memory according to the present invention includes a plurality of magnetic memory cells arranged in a matrix shape, each of the plurality of magnetic memory cells including the above magnetic memory element of the present invention.

According to the present invention, a magnetic memory element and magnetic memory using a domain wall motion, in which a writing current is small, a reading signal is large, and a cell size is small can be provided.

DESCRIPTION OF EXEMPLARY EMBODIMENTS

Exemplary embodiments of a magnetic memory element and magnetic memory of the present invention will be described below referring to the accompanying drawings.

1. Configuration

Figure 1A:
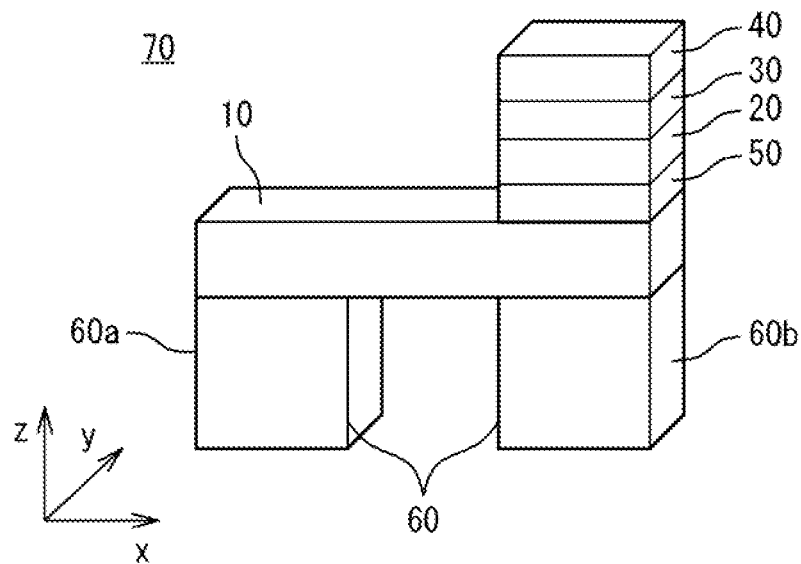
FIG. 1A is a schematic perspective view showing a typical configuration of a main part of a magnetic memory element according to the present invention.
Figure 1B:
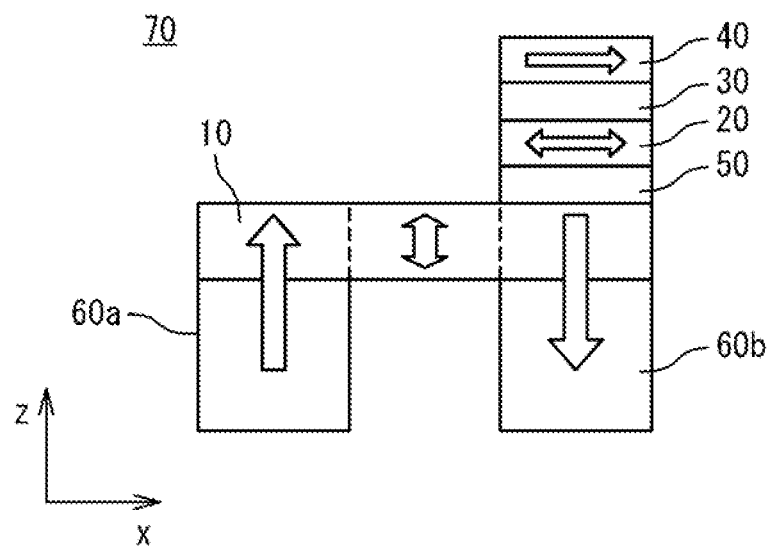
FIG. 1B is a schematic x-z sectional view showing a typical configuration of a main part of a magnetic memory element according to the present invention.
Figure 1C:
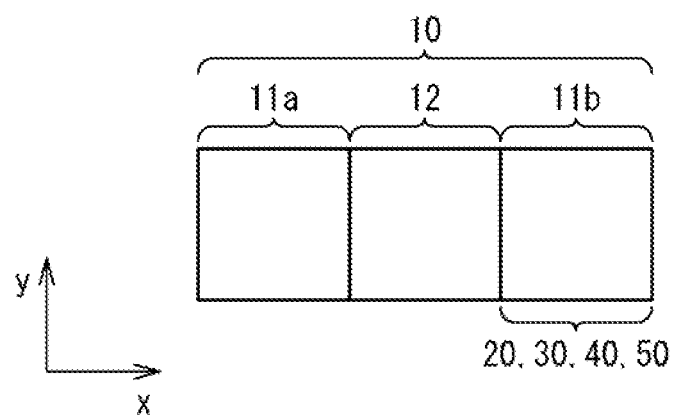
FIG. 1C is a schematic x-y plane view showing a typical configuration of a main part of a magnetic memory element according to the present invention.

A magnetic memory according to the exemplary embodiment of the present invention includes a plurality of magnetic memory cells arranged in a matrix shape. Each of the plurality of magnetic memory cells includes a magnetic memory element. Hereinafter, a configuration of a magnetic memory element will be described. FIGS. 1A, 1B and 1C are perspective, x-z sectional and x-y plane views, respectively, showing schematically a typical configuration of a main part of a magnetic memory element 70 according to the present invention. Here, in the x-y-z coordination system as shown in the drawings, the z axis is in a direction perpendicular to the substrate. The x axis and y axis are in directions parallel to the surface of the substrate. Each open arrow in FIG. 1B shows a magnetization direction of the layer. Each two-headed open arrow shows that a magnetization direction of the layer can take two directions. Hereinafter, these symbols are the similar to those in other drawings. The magnetic memory element 70 includes a first magnetic free layer 10, a second magnetic free layer 20, a non-magnetic layer 30 and a reference layer 40. In addition, the magnetic memory element 70 preferably includes a conductive layer 50 and a magnetization fixed layer group 60.

Figure 1D:
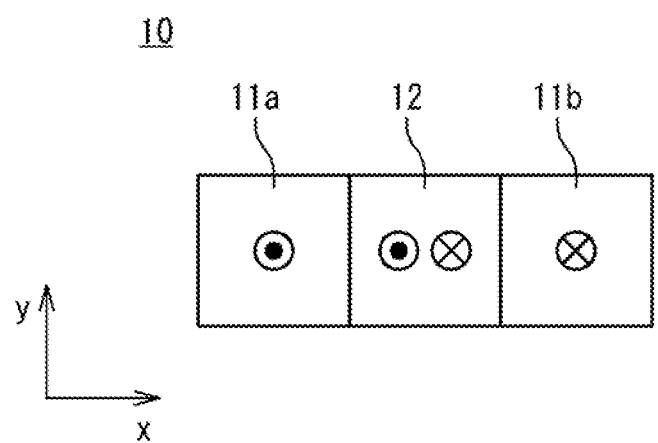
FIG. 1D is a schematic plane view showing a configuration of a magnetization free layer of a magnetic memory element according to the present invention.

FIG. 1D is a plane view schematically showing a configuration of a magnetization free layer 10 of a magnetic memory element 70 according to the present invention. The first magnetization free layer 10 includes three regions of a first magnetization fixed region 11a, a second magnetization fixed region 11b and a magnetization free region 12. The first magnetization fixed region 11a is adjacent to one end portion of the magnetization free region 12. The second magnetization fixed region 11b is adjacent to the other end portion of the magnetization free region 12. In the example shown in FIG. 1D, the first magnetization fixed region 11a is adjacent to the (−x)-direction-side end portion of the magnetization free region 12, and the second magnetization fixed region 11b is adjacent to the (+x)-direction-side end portion of the magnetization free region 12. Preferably, each of the first magnetization fixed region 11a, the second magnetization fixed region 11b and the magnetization free region 12 has an approximately square shape. In addition, the first magnetization fixed region 11a, the second magnetization fixed region 11b and the magnetization free region 12 are arranged linearly. In this case, the magnetization free layer 10 is a rectangle with an aspect ratio of about three (3).

In FIG. 1D, a symbol of an open circle with a dot shows a magnetization direction upward and perpendicular to the FIG. 1D-drawn-paper in the layer, and a symbol of an open circle with an X-mark shows a magnetization direction downward and perpendicular to the FIG. 1D-drawn-paper in the layer. The layer where the both symbols are drawn shows that the magnetization direction of the layer can take both directions. Hereinafter, these symbols are the similar to those in other drawings. The first magnetization free layer 10 is formed of a ferromagnetic material having perpendicular magnetic anisotropy. Each of the first magnetization fixed region 11a and the second magnetization fixed region 11b has magnetization which is substantially fixed in one direction. The magnetization of the first magnetization fixed region 11a is fixed in the direction mutually anti-parallel to the direction where the magnetization of the second magnetization fixed region 11b is fixed. In FIG. 1D, it is drawn that the magnetization of the first magnetization fixed region 11a is fixed in the +z direction, and the magnetization of the second magnetization fixed region 11b is fixed in the −z direction. The magnetization of the magnetization free region 12 can be switched. In this case, the magnetization of the magnetization free region 12 can be oriented in any one of the +z direction and the −z direction.

When the three regions in the magnetization free layer 10 have the above-mentioned magnetization structures, a domain wall is generated at any one of a boundary between the first magnetization fixed region 11a and the magnetization free region 12 and a boundary between the second magnetization fixed region 11b and the magnetization free region 12 based on the magnetization direction of the magnetization free region 12. In the case of FIG. 1D, when the magnetization of the magnetization free region 12 takes the +z direction, the domain wall is generated between the second magnetization fixed region 11b and the magnetization free region 12. When the magnetization of the magnetization free region 12 takes the −z direction, the domain wall is generated between the first magnetization fixed region 11b and the magnetization free region 12.

The second magnetization free layer 20, the non-magnetic layer 30 and the reference layer 40 are provided so as to be laminated in this order. The second magnetization free layer 20 and the reference layer 40 are formed of ferromagnetic materials. The non-magnetic layer 30 is formed of a non-magnetic material and preferably formed of an insulator. In this case, a laminated body with three layers of the second magnetization free layer 20, the non-magnetic layer 30 and the reference layer 40 constitutes the magnetic tunnel junction (MTJ). Here, shapes and positional relations of the second magnetization free layer 20, the non-magnetic layer 30 and the reference layer 40 are arbitrary. However, the second magnetization free layer 20 and the reference layer 40 are required to be provided such that at least a part of the second magnetization free layer 20 and at least a part of the reference layer 90 overlap in the x-y plane. In the example of FIGS. 1A to 1C, it is drawn that the second magnetization free layer 20, the non-magnetic layer 30 and the reference layer 40 have the same shape and overlap each other.

In the example of FIG. 1B, one example of the magnetization directions that the second magnetization free layer 20 and reference layer 40 can take are indicated by using the arrows. The second magnetization free layer 20 is preferably formed of a ferromagnetic material having in-plane magnetic anisotropy. The magnetization free layer 20 has the magnetization which can be switched. The magnetization which can be switched in the magnetization free layer 20 is magnetically coupled with the magnetization of the magnetization free region 12 in the magnetization free layer 10. In other words, when the magnetization direction of the magnetization free region 12 is changed, in association with the change, the magnetization direction of the magnetization free layer 20 can be also changed. In the example of FIG. 1B, the magnetization direction of the magnetization free region 12 can take one of the +z direction and the −z direction, and the magnetization direction of the second magnetization free layer 20 can take one of the +x direction and the −x direction.

The reference layer 40 has the magnetization which is substantially fixed in one direction. In the example of FIG. 1B, the magnetization direction of the reference layer 40 is fixed in the −x direction. In addition, the reference layer 40 may have a lamination structure (not shown here) described below. For example, the reference layer 40 preferably has a structure in which a ferromagnetic layer, a non-magnetic layer and a ferromagnetic layer are laminated in this order. Here, it is preferable that the non-magnetic layer sandwiched between two ferromagnetic layers has a function so as to magnetically (synthetic-ferrimagnetically) couple the upper ferromagnetic layer and the lower ferromagnetic layer in an anti-parallel direction. As a non-magnetic material having such a function, Ru is exemplified. By applying the lamination structure having the synthetic ferrimagnetical coupling to the reference layer 40, a leakage magnetic field to outside is reduced, thereby enabling a magnetic influence on other layers such as the second magnetization free layer to be reduced. In addition, the reference layer is preferably adjacent to an anti-ferromagnetic body. This is because a magnetization direction of the interface can be fixed in one direction by adjoining the anti-ferromagnetic body and executing heat treatment in a magnetic field. As a typical anti-ferromagnetic material, Pt—Mn is exemplified.

The second magnetization free layer 20, the non-magnetic layer 30 and the reference layer 40 are preferably included in the first magnetization free layer 10 in the x-y plane. In addition, the position of the second magnetization free layer 20 in the x-y plane is required to be deviated in a certain direction with respect to the position of the magnetization free region 12 of the first magnetization free layer 10. More preferably, the second magnetization free layer 20 is provided above or below one of the first magnetization fixed region 11a and the second magnetization fixed region 11b. In the example of FIGS. 1A to 1C, the magnetization free layer 20 is provided above the first magnetization fixed region 11b. Further, as described above, the reference layer 40 has the magnetization which is substantially fixed in a certain direction. Here, this fixed magnetization direction is preferably parallel to the direction in which the second magnetization free layer 20 is deviated with respect to the magnetization free region 12. In the example of FIGS. 1A to 1C, the second magnetization free layer 20 is deviated in the +x direction with respect to the magnetization free region 12 and the magnetization of the reference layer 40 is fixed in the +x direction.

The conductive layer 50 is provided between the first magnetization free layer 10 and the MTJ which includes the second magnetization free layer 20, the non-magnetic layer 30 and the reference layer 40. The conductive layer 50 electrically connects the first magnetization free layer 10 and the MTJ. The shape of the conductive layer 50 is arbitrary. In the example of FIGS. 1A to 1C, the shape of the conductive layer is the same as that of the MTJ.

The magnetization fixed layer group 60 is formed of at least one of a ferromagnetic material and an anti-ferromagnetic material. The magnetization fixed layer 60 has a function that it makes the magnetization of the first magnetization fixed region 11a and the magnetization of the second magnetization fixed region 11b fix in certain directions anti-parallel to each other. The magnetization fixed layer group 60 may includes two regions of a first magnetization fixed layer group 60a and a second magnetization fixed layer group 60b, as shown in the example of FIGS. 1A to 1C. Here, the first magnetization fixed layer group 60a is magnetically-coupled with the first magnetization fixed region 11a, and the second magnetization fixed layer group 60b is magnetically-coupled with the second magnetization fixed region 11b. In the example of FIGS. 1A to 1C, the first magnetization fixed layer group 60a and the second magnetization fixed layer group 60b are formed of a ferromagnetic material. The first magnetization fixed layer group 60a and the first magnetization fixed region 11a are ferromagnetically-coupled with each other and the second magnetization fixed layer group 60b and the second magnetization fixed region 11b are ferromagnetically-coupled with each other. Here, in the example of FIGS. 1A to 1C, the magnetization fixed layer group 60 and the magnetization free layer 10 are provided adjacent to each other. However, since all these layers need to be magnetically-coupled with each other, these layers may be electrically isolated from each other. The specific configuration example of the magnetization fixed layer group 60 will be described later.

Each of the magnetization fixed region 11a and the magnetization fixed region 11b is connected to a different external wiring line. In addition, one side of the MTJ, which is opposite to the other side where the magnetization free layer 10 is connected, is connected to another external wiring line. That is, the magnetic memory element 70 is a three-terminal element. When the magnetization free layer 10 is electrically connected to the magnetization fixed layer group 60, the magnetization fixed layer group 60 may be placed on a path where the magnetization free layer 10 is connected the external wiring lines. That is, in the example of FIGS. 1A to 1C, each of the first magnetization fixed layer group 60a and the second magnetization fixed layer group 60b may be connected to different external wiring line.

2. Memory States

Figure 2A:
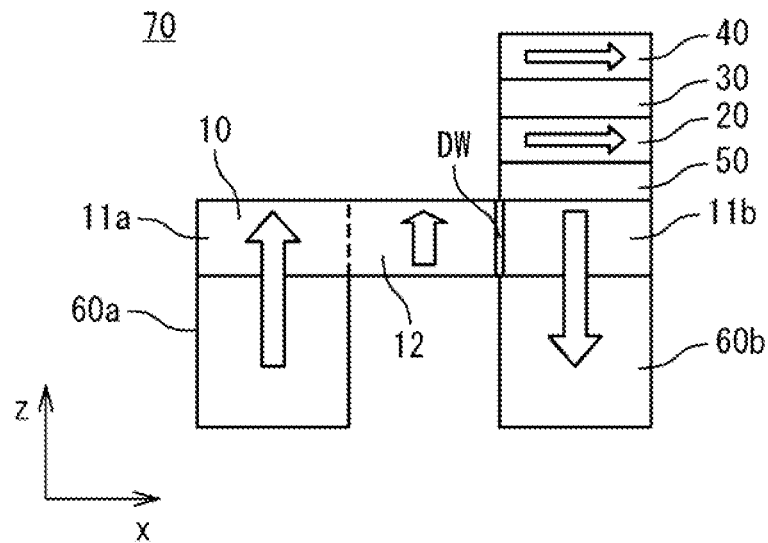
FIG. 2A is a schematic sectional view showing an example of a magnetization state in a "0" memory state of a magnetic memory element according to an exemplary embodiment of the present invention.
Figure 2B:
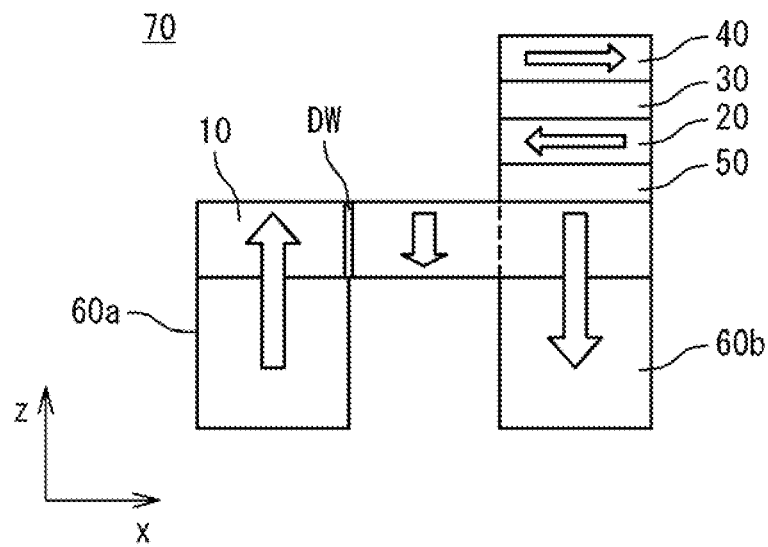
FIG. 2B is a schematic sectional view showing an example of a magnetization state in a "1" memory state of a magnetic memory element according to the exemplary embodiment of the present invention.

Next, memory states of the magnetic memory element according to the exemplary embodiment of the present invention will be described. FIGS. 2A and 2B are schematic sectional views showing examples of magnetization states in "0" and "1" memory states, respectively, of the magnetic memory element according to an exemplary embodiment of the present invention. FIG. 2A shows the magnetization state in the "0" state, and FIG. 2B shows the magnetization state in the "1" state. Here, the magnetization of the magnetization fixed region 11a is fixed in the +z direction, and the magnetization of the magnetization fixed region 11b is fixed in the −z direction. In the "0" state shown in FIG. 2A, the magnetization of the magnetization free region 12 has the (+z)-directional component. In this case, a domain wall DW is formed at a boundary between the second magnetization fixed region 11b and the magnetization free region 12. On the other hand, in the "1" state shown in FIG. 2B, the magnetization free region 12 has the (−z)-directional component. In this case, the domain wall DW is formed at a boundary between the first magnetization fixed region 11a and the magnetization free region 12. When the magnetization free region 12 is in each of the states described above, the magnetization of the second magnetization free layer 20 has the (+x)-directional component in the "0" state shown in FIG. 2A. On the other hand, the magnetization of the second magnetization free layer 20 has the (−x)-directional component in the "1" state shown in FIG. 2B.

Figure 2C:
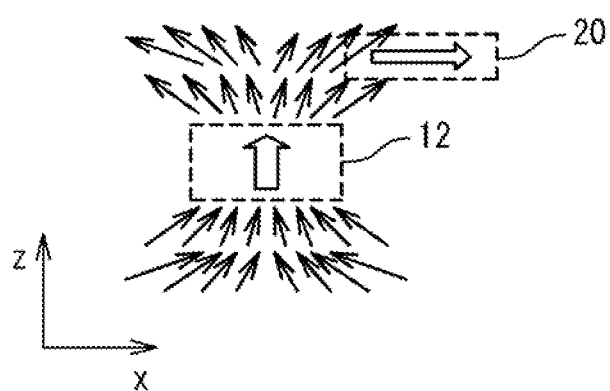
FIG. 2C is a schematic sectional view showing a coupling between a magnetization of a magnetization free region and a magnetization of a second magnetization free layer.
Figure 2D:
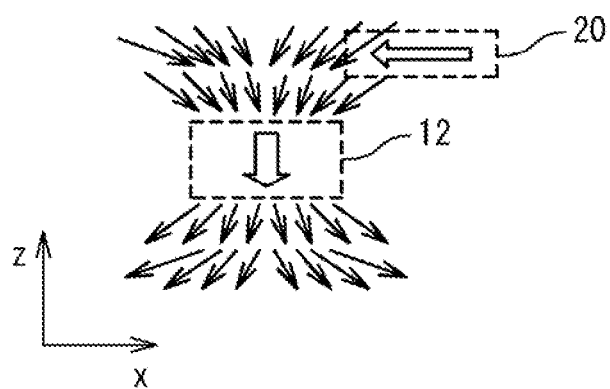
FIG. 2D is a schematic sectional view showing a coupling between a magnetization of an magnetization free region and a magnetization of a second magnetization free layer.

FIGS. 2C and 2D are schematic sectional views showing magnetic coupling between the magnetization free region 12 and the second magnetic free layer 20. In FIGS. 2C and 2D, only the magnetization free region 12 and the second magnetic free layer 20 are shown. When the magnetization free region 12 has the magnetization in the +z direction as shown in FIG. 2C, a leakage magnetic field is generated around the magnetization free region 12. Here, at the position of the second magnetization free layer 20, the leakage magnetic field has the (+x)-directional component as the arrows shown in the drawing. Therefore, the magnetization of the second magnetization free layer is oriented in the +x direction. On the other hand, when the magnetization free region 12 has the magnetization in the −z direction as shown in FIG. 2D, a leakage magnetic field is generated around the magnetization free region 12. Here, at the position of the second magnetization free layer 20, the leakage magnetic field has the (−x)-directional component as the arrows shown in the drawing. Therefore, the magnetization of the second magnetization free layer is oriented in the −x direction.

In this way, since the second magnetization free layer 20 is deviated in a certain direction with respect to the magnetization free region 12 in the x-y plane, the magnetization direction of the second magnetization free layer 20 can be switched by using the leakage magnetic field in the x-y plane. Incidentally, the deviation direction of the second magnetization free layer 20 with respect to the magnetization free region 12 is a first direction, the magnetization of the second magnetization free layer 20 takes one of a parallel component and an anti-parallel component to the first direction depending on the stored data. On the other hand, as mentioned before, the magnetization of the reference layer 90 is preferably fixed in a direction approximately parallel to the first direction. In this case, depending on the data stored in the magnetization free region 12, the MTJ including the second magnetization free layer 20, the non-magnetic layer 30 and the reference layer 40 is in one of the parallel state (having the parallel component) and the anti-parallel state (having the anti-parallel component).

It is apparent that the relation between the magnetization states and the memory states ("0", "1") defined in FIGS. 2A and 2B is arbitrary and is not limited to this case.

3. Writing Method

Figure 3A:
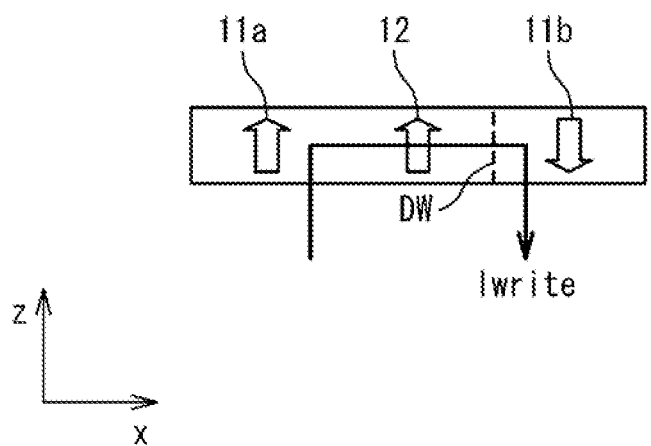
FIG. 3A is a schematic sectional view showing an example of a method of writing data to a magnetic memory element according to the present invention.
Figure 3B:
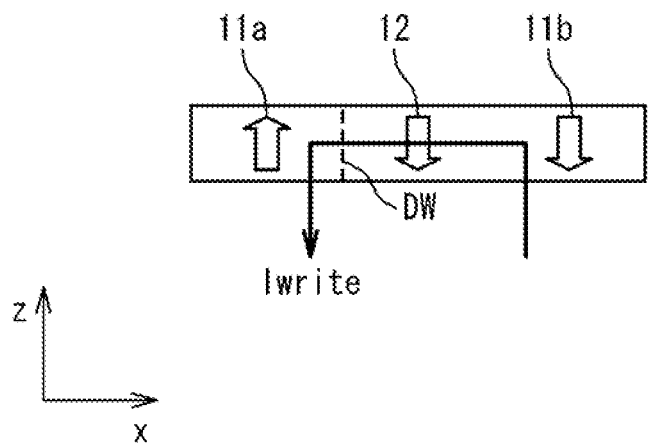
FIG. 3B is a schematic sectional view showing an example of a method of writing data to a magnetic memory element according to the present invention.

Next, a method of writing data to the magnetic memory element according to the exemplary embodiment of the present invention will be described. FIGS. 3A and 3B are schematic sectional views showing an example of a method of writing data to the magnetic memory element according to the present invention. Here, to simplify the drawings, the layers except the first magnetization free layer 10 are omitted in FIGS. 3A and 3B. In the "0" state defined at FIG. 2A, a writing current is introduced in a direction shown as an arrow of $I_{write}$ in FIG. 3A. In this case, conduction electrons flow from the second magnetization fixed region 11b to the first magnetization fixed region 11a through the magnetization free region 12 in the first magnetization free layer 10. At this time, the spin transfer torque (STT) acts on the domain wall DW generated at the boundary between the second magnetization free region 11b and the magnetization free region 12 to move the domain wall DW in the −x direction. That is, the current-induced domain wall motion arises. The conduction electrons decrease beyond the boundary between the first magnetization fixed region 11a and the magnetization free region 12 in the −x direction. Therefore, the domain wall DW stops at the boundary between the first magnetization fixed region 11a and the magnetization free region 12. This state corresponds to the "1" state defined at FIG. 2B. In this way, the "1" writing can be performed.

In the "1" state defined at FIG. 2B, a writing current is introduced in a direction shown as an arrow of $I_{write}$ in FIG. 3B. In this case, conduction electrons flow from the first magnetization fixed region 11a to the second magnetization fixed region 11b through the magnetization free region 12 in the first magnetization free layer 10. At this time, the spin transfer torque (STT) acts on the domain wall DW generated at the boundary between the first magnetization free region 11a and the magnetization free region 12 to move the domain wall DW in the +x direction. That is, the current-induced domain wall motion arises. The conduction electrons decrease beyond the boundary between the second magnetization fixed region 11b and the magnetization free region 12 in the +x direction. Therefore, the domain wall DW stops at the boundary between the second magnetization fixed region 11b and the magnetization free region 12. This state corresponds to the "0" state defined at FIG. 2A. In this way, the "0" writing can be performed.

Incidentally, when the "0" writing in the "0" state and the "1" writing in the "1" state are performed, the respective states are not changed. That is, it is possible to perform over-writing. In addition, when the magnetization state of the first magnetization free layer 10 is rewritten by the current, the magnetization direction of the second magnetization free layer 20 is concurrently changed as shown in FIGS. 2A to 2D.

4. Reading Method

Figure 4A:
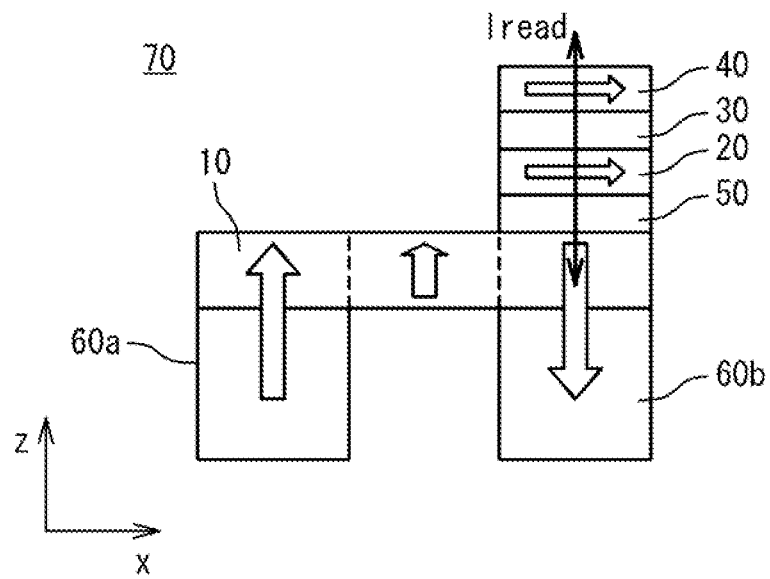
FIG. 4A is a schematic sectional view showing an example of a method of reading data from a magnetic memory element having a configuration shown in FIGS. 1A to 1D.
Figure 4B:
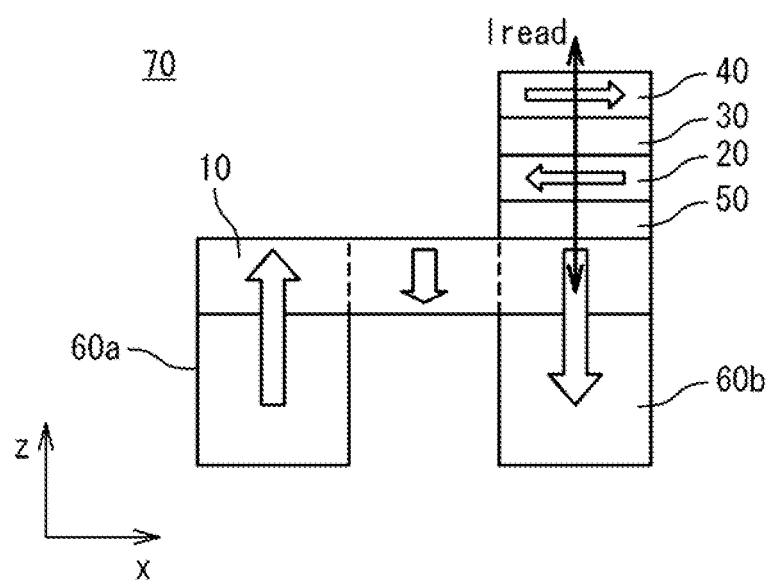
FIG. 4B is a schematic sectional view showing an example of a method of reading data from a magnetic memory element having a configuration shown in FIGS. 1A to 1D.

Next a method of reading data from the magnetic memory element according to the exemplary embodiment of the present invention will be described. FIGS. 4A and 4B are schematic sectional views showing an example of a method of reading data from the magnetic memory element having a configuration shown in FIGS. 1A to 1D. In the present exemplary embodiment, the data is read by mainly using the tunneling magnetoresistive effect (TMR effect). Therefore, the reading current $I_{read}$ is introduced into the magnetic tunnel junction (MTJ) in a direction which passes through the MTJ, the MTJ being constituted by the second magnetization free layer 20, the non-magnetic layer 30 and the reference layer 40. Here, the reading current $I_{read}$ is arbitrary.

Figure 9A:
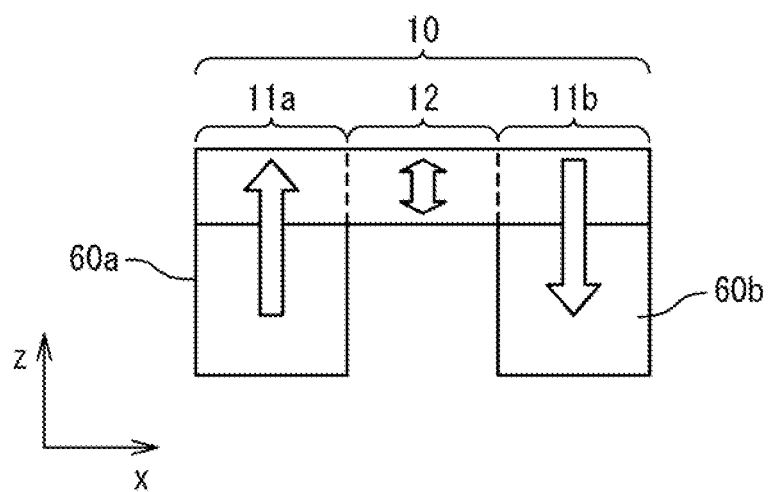
FIG. 9A is a schematic sectional view showing a configuration of a second modification example of a magnetic memory element according to the exemplary embodiment of the present invention.

Here, as shown in FIG. 9A, in the "0" state defined in FIG. 2A, when the reading current $I_{read}$ is introduced into the MTJ, since the magnetization of the MTJ is in the parallel state, the low resistance value can be obtained. On the other hand, as shown in FIG. 4B, in the "1" state defined in FIG. 2B, when the reading current is introduced into the MTJ, since the magnetization of the MTJ is in the anti-parallel state, the high resistance value can be obtained. In this way, the data stored in the magnetic memory element 70 can be detected as the difference of the resistance value.

5. Circuit Configuration

Figure 5:
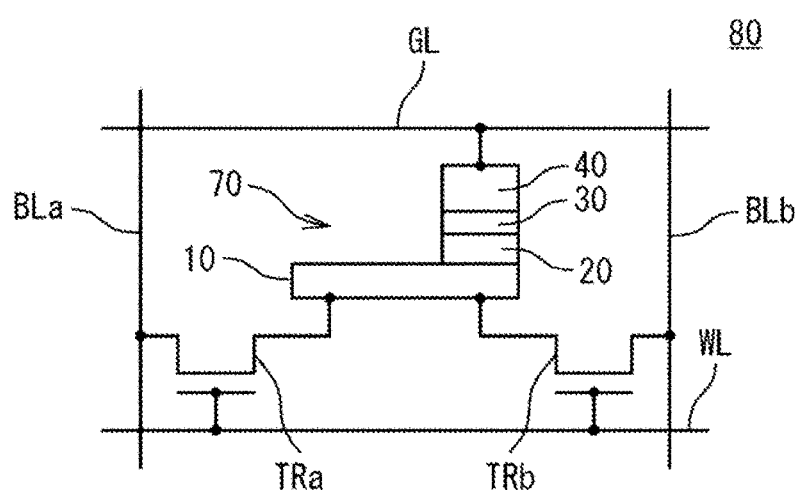
FIG. 5 is a block diagram showing an example of a configuration of a one-bit circuit of a magnetic memory cell according to the exemplary embodiment of the present invention.

A circuit configuration for introducing the writing current and the reading current into a magnetic memory cell 80 including the magnetic memory element 70 according to the exemplary embodiment of the present invention. FIG. 5 is a block diagram showing an example of a configuration of a one-bit circuit of the magnetic memory cell 80 according to the exemplary embodiment of the present invention. In the example of FIG. 5, the magnetic memory cell 80 includes the magnetic memory element 70 and transistors TRa and TRb. The magnetic memory element 70 is an element with three terminals, and is connected to a word line WL, a ground line GL and a pair of bit lines BLa and BLb. For example, the terminal connected to the reference layer 40 is connected to the ground line GL for reading. The terminal connected to the first magnetization fixed region 11a (through the first magnetization fixed layer group 60a) is connected to one of a source and a drain of the transistor TRa. The other of the source and the drain is connected to the bit line BLa. The terminal connected to the second magnetization fixed region 11b (through the second magnetization fixed layer group 60b) is connected to one of a source and a drain of the transistor TRb. The other of the source and the drain is connected to the bit line BLb. Gates of the transistors TRa and TRb are connected to the common word line WL.

In the data writing, the word line WL is set to the High level, thereby turning on the transistors TRa and TRb. In addition, one of the bit lines BLa and BLb is set to the High level and the other is set to the Low level (ground level). As a result, the writing current $I_{write}$ flows between the bit lines BLa and BLb through the transistor TRa and TRb and first magnetization free layer 10.

In the data reading, the word line WL is set to the High level, thereby turning on the transistors TRa and TRb. In addition, the bit line BLa is set to an open state and the bit line BLb is set to the High level. As a result, the reading current Iread flows from the bit line BLb through the transistor TRb and the MTJ of the magnetic memory element 70 to the ground line GL. This makes it possible to read data using the magnetoresistive effect.

Figure 6:
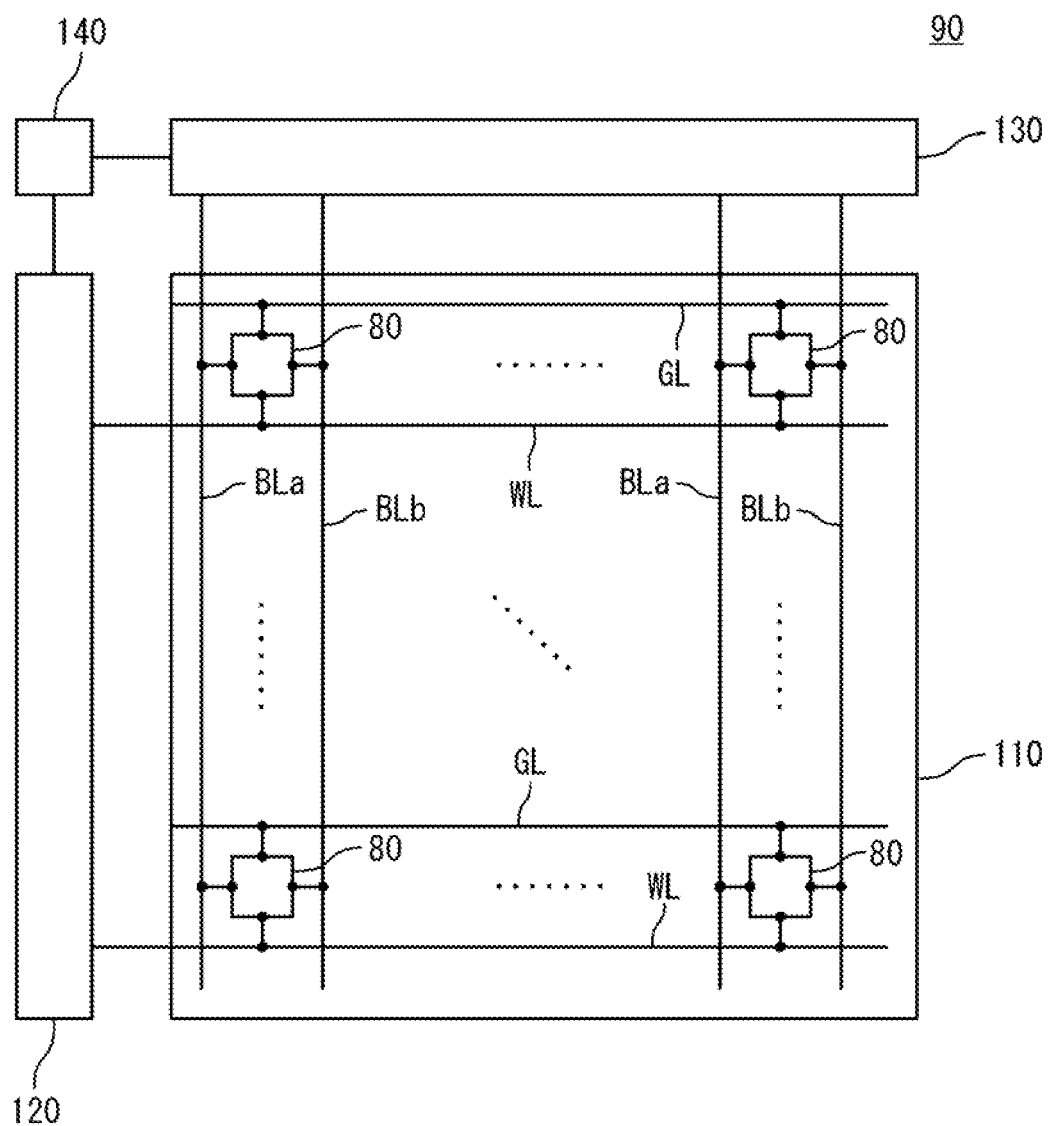
FIG. 6 is a block diagram showing an example of a configuration of a magnetic memory according to the exemplary embodiment of the present invention.

FIG. 6 is a block diagram showing an example of a configuration of a magnetic memory 90 according to the exemplary embodiment of the present invention. The magnetic memory 90 includes a memory cell array 110, an X driver 120, a Y driver 130 and a controller 140. The memory cell array 110 includes a plurality of the magnetic memory cells 80 arranged in a matrix shape. The magnetic memory cell 80 includes the above-mentioned magnetic memory elements 70. As shown in FIG. 5, the magnetic memory cell 80 is connected to the word line WL, the ground line GL, and a pair of the bit lines BLa and BLb. The X driver 120 is connected to a plurality of the word lines and drives a selected word line WL connected to a magnetic memory cell 80 which is an access target in the plurality of the word line WL. The Y driver 130 is connected to a plurality of the pairs of the bit lines BLa and BLb and sets respective bit lines to the states corresponding to the data writing or the data reading. The controller 140 controls each of the X driver 120 and the Y driver 130 based on the data writing or the data reading.

6. Layout

Figure 7A:
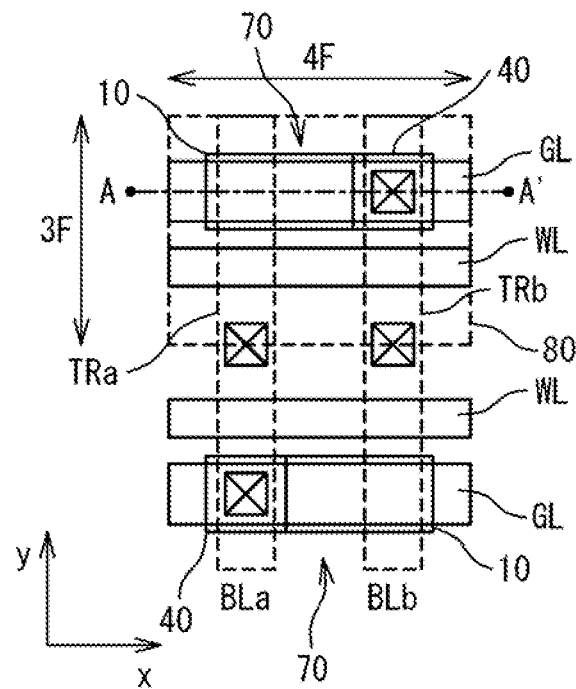
FIG. 7A is a schematic x-y plane view showing an example of a layout of a magnetic memory cell according to the exemplary embodiment of the present invention.
Figure 7B:
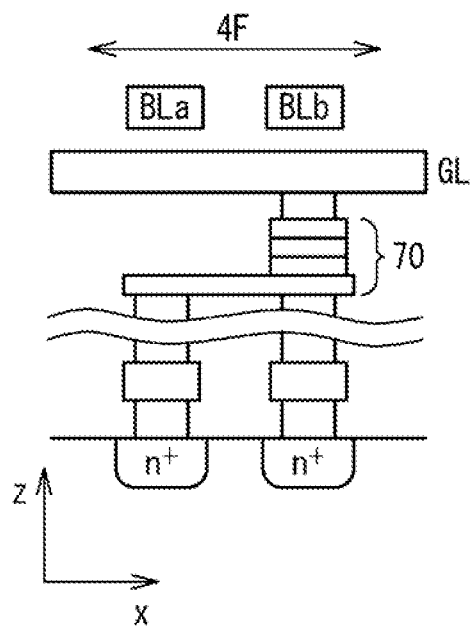
FIG. 7B is a schematic x-z sectional view showing an example of a layout of a magnetic memory cell according to the exemplary embodiment of the present invention.

Next, a layout of the magnetic memory cell 80 according to the exemplary embodiment of the present invention. FIGS. 7A and 7B are an x-y plane view and an x-z sectional view showing an example of a layout of the magnetic memory cell 80 according to the exemplary embodiment of the present invention. Here, FIG. 7B is the A-A' section in FIG. 7A. In FIGS. 7A and 7B, the transistors TRa and TRb are provided extending in the y directions, and share area for one of the source and the drain with each other. The ones of the source and the drain in the shared area are connected to the bit lines BLa and BLb, respectively, in the top layer through vias. The bit lines BLa and BLb are provided extending in the y directions. Further, the gate electrodes of the transistor TRa and TRb are connected to the common word line WL. The word line WL is provided extending in the x direction. The others of the source and the drain, which are not connected to the bit lines BLa and BLb, respectively, are connected to the magnetic memory element 70. The terminal in the side of the MTJ of the magnetic memory element 70 is connected to the ground line GL at the upper layer. The ground line GL is provided extending in the x direction.

Here, the magnetic memory element 70 is preferably a rectangle in which the magnetization free layer 10 has an aspect ratio of three (3). The MTJ is provided so as to be included in the magnetization free layer 10 in the x-y plane. Therefore, the magnetic memory element 70 is a rectangle in which the magnetization free layer 10 has an aspect ratio of three. In this case, as shown in the drawing, the cell area of the magnetic memory cell 80 is 3 F×4 F=12 $F^2$. Here, the F is the design rule (or ½ of a metal layer pitch). The cell area of 12 $F^2$ realized in the layout of FIGS. 7A and 7B is the minimum layout in the 2T-1MTJ circuit configuration suitable for the high-speed MRAM. Therefore, by using the magnetic memory element 70 according to the exemplary embodiment of the present invention, the cell area of the high-speed MRAM can be maximally reduced, thereby suppressing the manufacturing costs.

7. Material

Next, materials applicable to the first magnetization free layer 10, the second magnetization free layer 20, the non-magnetic layer 30, the reference layer 40, the conductive layer 50, and the magnetization fixed layer group 60 will be described.

The first magnetization free layer 10 is preferably formed of a ferromagnetic material with perpendicular magnetic anisotropy as described above. Specifically, it is exemplified by alloy materials such as Fe—Pt alloy, Fe—Pd alloy, Co—Pt alloy, Co—Pd alloy, Tb—Fe—Co alloy, Gd—Fe—Co alloy, Tb—Fe alloy, Tb—Co alloy, Gd—Fe alloy, Gd—Co alloy, Co—Cr—Pt alloy, Co—Re—Pt alloy, Co—Ru—Pt alloy, and Co—W alloy. In addition, it is exemplified by alternately-laminated films such as Co/Pt lamination film, Co/Pd lamination film, Co/Ni lamination film, Co/Cu lamination film, Co/Ag lamination film, Co/Au lamination film, Fe/Pt lamination film, Fe/Pd lamination film, and Fe/Au lamination film. Especially, the inventors et al. were experimentally found out that the highly-controllable current induced domain wall motion can be realized by using the Co/Ni lamination film in the above-described materials. (Non Patent Literature 5 (Applied Physics Express, vol. 1, p. 101303 (2008))). In this regard, the Co/Ni lamination film is a preferable material as the magnetization free layer 10.

The second magnetization free layer 20 is formed of a ferromagnetic material with in-plane magnetic anisotropy. Further, since it is necessary to react sensitively to the magnetization direction of the magnetization free region 12, the material is required to be magnetically soft. It is exemplified by Ni—Fe, Co—Fe—B and the like as such materials. The non-magnetic layer 30 is preferably formed of an insulating material. Specifically, it is exemplified by Mg—O, Al—O Al—N, Ti—O and the like. The reference layer 40 is formed of a ferromagnetic material with in-plane magnetic anisotropy. Specifically, a lot of materials can be used. Typically, one of Fe, Co, and Ni is included. In addition, the magnetization direction is required to be fixed in a certain direction and the leakage magnetic field to outside is preferably small. Thus, as described before, the lamination structure with the synthetic ferrimagnetic coupling or the structure to which an anti-ferromagnetic layer is adjacent is preferable. The specific lamination structure of the reference layer 40 is exemplified by Co—Fe—B/Ru/Co—Fe/Pt—Mn from the side of the non-magnetic layer 30 in this order.

Any of conductive materials can be used for the conductive layer 50. Specifically, it is exemplified by Ta, W, Ti, Ru, Cu and the like. The magnetization fixed layer group 60 includes a ferromagnetic material. Here, as an example of the case that the magnetization fixed layer group 60 includes the first magnetization fixed layer group 60a and the second magnetization fixed layer group 60b, and each of the first magnetization fixed layer group 60a and the second magnetization fixed layer group 60b is formed of a single ferromagnetic material as shown in FIGS. 1A to 1D, the material may include a ferromagnetic material with perpendicular magnetic anisotropy. The specifically usable materials are the same as those of the first magnetization free layer 10 as exemplified above, and therefore the description thereof is omitted.

8. Effects

Next, the effects which can be obtained in the present invention will be described.

In the present invention, by forming the first magnetization free layer 10, where the current induced domain wall motion arises, of a ferromagnetic material with perpendicular magnetic anisotropy, the writing current can be reduced. For example, by appropriately selecting a material of the first magnetization free layer 10, the writing current density can be reduced to approximately $5\times10^{11}$ [A/m$^2$]. In this case, when it is assumed that the width and thickness of the first magnetization free layer 10 are 90 nm and 4 nm, respectively, the writing current is approximately 1.8 mA. Therefore, the minimum layout of the 2T-1MTJ circuit configuration suitable for the high-speed operation can be achieved.

In the present invention, the MTJ for reading includes the second magnetization free layer 20, the non-magnetic layer 30 and the reference layer 40, and the second magnetization free layer 20 and the reference layer 40 are formed of ferromagnetic materials with in-plane magnetic anisotropy. Therefore, it can be relatively easy to obtain the large TMR ratio over 100%, thereby enabling the high-speed reading operation.

In addition, the MTJ for reading is formed so as to be included in the first magnetization free layer 10 in the x-y plane. Therefore, the cell area is not increased. Particularly, when the first magnetization free layer 10 is formed as a rectangle with an aspect ratio of three, the layout with 12 F$^2$ can be realized. As a result, the MRAM with the same cost performance as that of an existing embedded memory can be provided.

In the present invention, by using the first magnetization free layer 10 formed of a ferromagnetic material with perpendicular magnetic anisotropy, the writing current at the first magnetization free layer 10 of the domain wall motion magnetic memory element 70 can be reduced. In addition, by using the second magnetization free layer 20 and the reference layer 40 formed of ferromagnetic materials with in-plane magnetic anisotropy to form the MTJ for reading, the large reading signal can be obtained. Further, by forming the MTJ for reading so as to be included in the first magnetization free layer 10 in the surface parallel to the substrate, the increase of the cell area can be avoided. Consequently, the layout with small memory cells, each having 12 F$^2$, can be achieved. As mentioned above, the present invention can provide the domain wall motion magnetic memory element and the magnetic memory (e.g., MRAM) using the same, in which the writing current is small, the reading current is large, and the cell area is small.

9. Modification Examples

The above-described magnetic memory may be executed using below described modification examples.

First Modification Example

Figure 8A:
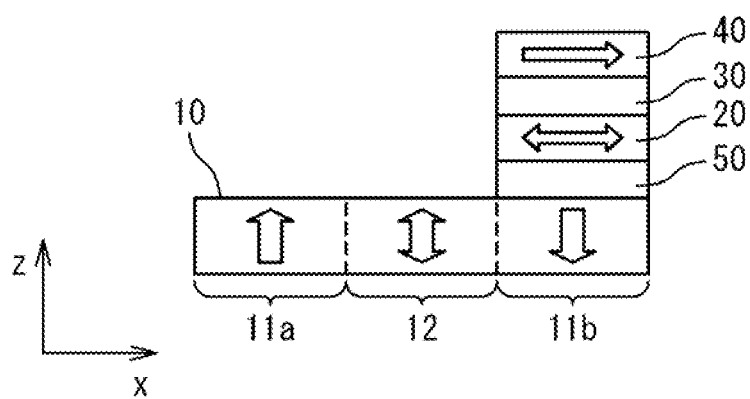
FIG. 8A is a schematic sectional view showing a configuration of a first modification example of a magnetic memory element according to the exemplary embodiment of the present invention.
Figure 8B:
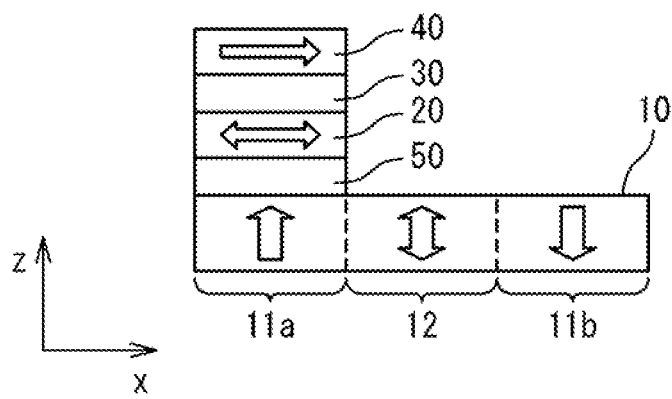
FIG. 8B is a schematic sectional view showing a configuration of a first modification example of a magnetic memory element according to the exemplary embodiment of the present invention.
Figure 8C:
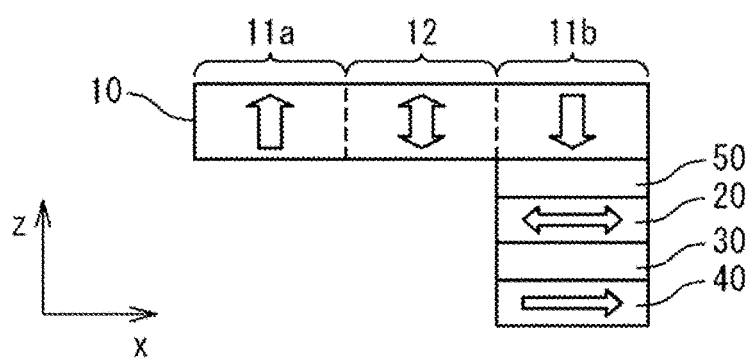
FIG. 8C is a schematic sectional view showing a configuration of a first modification example of a magnetic memory element according to the exemplary embodiment of the present invention.

FIGS. 8A to 8C are schematic sectional views showing a configuration of a first modification example of the magnetic memory element 70 according to the exemplary embodiment of the present invention. The first modification example relates to the position of the MTJ including the second magnetization free layer 20, the non-magnetic layer 30, and the reference layer 40.

In the magnetic memory element 70, the MTJ may be arranged anywhere, if the second magnetization free layer 20 is provided deviating from the magnetization free region 12 in the x-y plane. Therefore, the MTJ may be arranged above the second magnetization fixed region 11b as shown in FIG. 8A, the MTJ may be arranged above the first magnetization fixed region 11a as shown in FIG. 8B, the MTJ may be arranged below the second magnetization fixed region 11b as shown in FIG. 8C, and the MTJ may be arranged below the first magnetization fixed region 11a which is not shown in a drawing.

Incidentally, in any cases, the MTJ including the second magnetization free layer 20, the non-magnetic layer 30 and the reference layer 40 is formed so as to be included in the first magnetization free layer 10 in the x-y plane. This is because by forming the MTJ including the second magnetization free layer 20, the non-magnetic layer 30 and the reference layer 40 so as to be included in the first magnetization free layer 10 in the x-y plane, the cell area can be reduced as described above. In any of the cases of FIGS. 8A, 8B and 8C, the magnetic memory element 70 has a rectangle shape with an aspect ratio of three, and can be laid out in the cell area of 12 F$^2$.

Second Modification Example

FIGS. 9A to 9E are schematic sectional views showing a configuration of a second modification example of the magnetic memory element 70 according to the exemplary embodiment of the present invention. The second modification example relates to magnetization fixed layer group 60.

In the magnetic memory element 70, the magnetization fixed layer group 60 is preferably provided so as to make the magnetization of the first magnetization fixed region 11a and the second magnetization fixed region 11b of the magnetization free layer 10 turn to directions anti-parallel to each other and fix each of the magnetization in a certain direction. Here, the structure of the magnetization fixed layer group 60 is arbitrary.

FIG. 9A shows one example. The first magnetization fixed layer group 60a is provided adjacent to and under the first magnetization fixed region 11a and the second magnetization fixed layer group 60b is provided adjacent to and under the second magnetization fixed region 11b. Here, magnetic properties of the first magnetization fixed layer group 60a may be different from those of the second magnetization fixed layer group 60b.

Figure 9B:
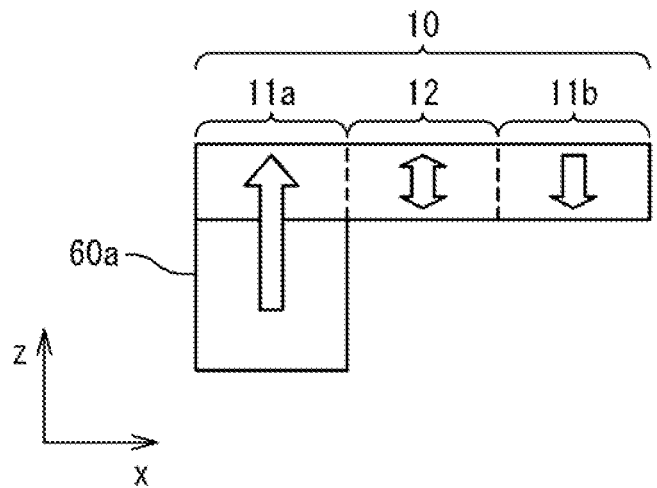
FIG. 9B is a schematic sectional view showing a configuration of a second modification example of a magnetic memory element according to the exemplary embodiment of the present invention.

FIG. 9B shows another example. The magnetization fixed layer group 60 is provided only one in this example. In FIG. 9B, the first magnetization fixed layer group 60a is provided adjacent to only the first magnetization fixed region 11a, and the magnetization fixed layer group 60b is not provided near the second magnetization fixed region 11b. Even in this case, it is possible to make the magnetization of the first magnetization fixed region 11a and the second magnetization fixed region 11b turn to directions anti-parallel to each other.

Figure 9C:
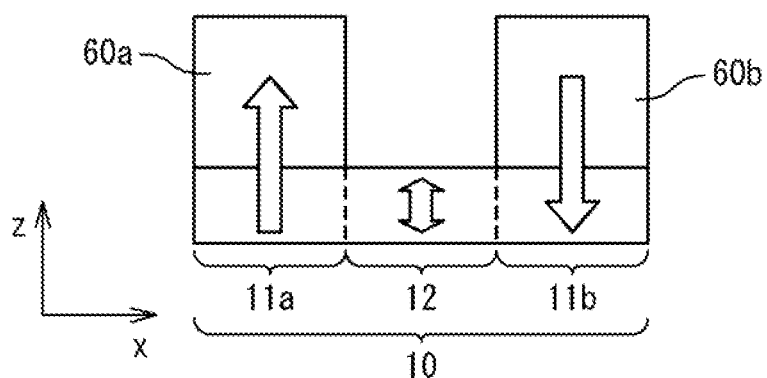
FIG. 9C is a schematic sectional view showing a configuration of a second modification example of a magnetic memory element according to the exemplary embodiment of the present invention.

FIG. 9C shows another example. The magnetization fixed layer group 60 is provided adjacent to and above the first magnetization free layer 10. As shown in FIG. 9C, the magnetization fixed layer group 60 may be provided above the first magnetization free layer 10. The magnetization fixed layer group 60 may be provided anywhere in a region where the magnetization fixed layer group 60 can magnetically influence the first magnetization fixed region 11a and/or the second magnetization fixed region 11b.

Figure 9D:
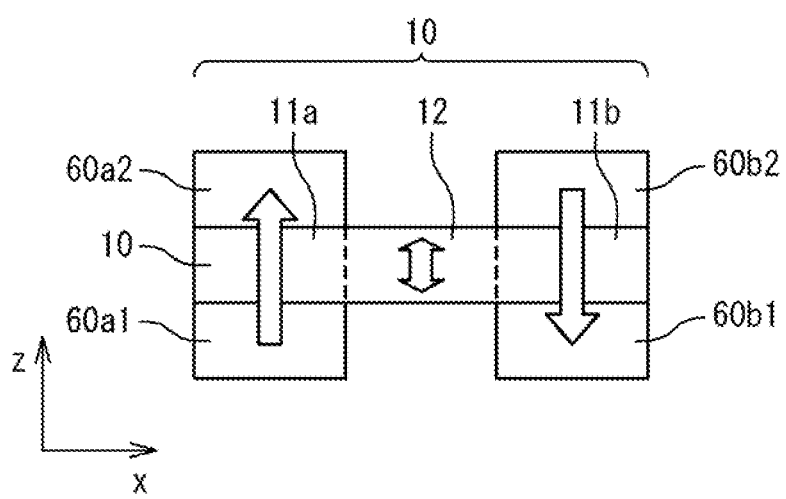
FIG. 9D is a schematic sectional view showing a configuration of a second modification example of a magnetic memory element according to the exemplary embodiment of the present invention.

FIG. 9D shows another example. The magnetization fixed layer group 60 is provided adjacent to and both of above and below the first magnetization free layer 10. In FIG. 9D, the first and third magnetization fixed layer groups 60a1 and 60a2 are provided adjacent to the first magnetization fixed region 11a, and the second and fourth magnetization fixed layer groups 60b1 and 60b2 are provided adjacent to the second magnetization fixed region 11b. In this way, the number of the magnetization fixed layer group 60 is arbitrary and the magnetization fixed layer group 60 may be provided as many as possible.

Figure 9E:
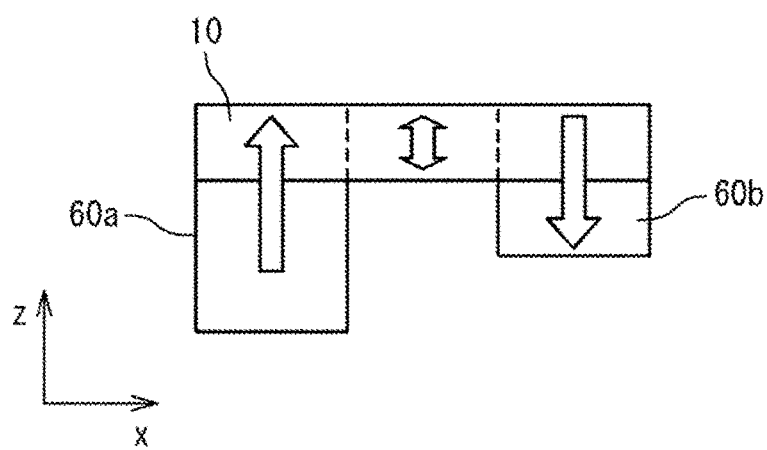
FIG. 9E is a schematic sectional view showing a configuration of a second modification example of a magnetic memory element according to the exemplary embodiment of the present invention.

FIG. 9E shows another example. The plurality of the magnetization fixed layer groups 60 is provided and has different structures from each other. In FIG. 9E, the thickness of the first magnetization fixed layer group 60a provided adjacent to the first magnetization fixed region 11a is thicker than the thickness of the second magnetization fixed layer group 60b provided adjacent to the second magnetization fixed region 11b. In this way, the structure of the first magnetization fixed layer group 60a may be different from the structure of the second magnetization fixed layer group 60b, and shapes other than the thicknesses may be different.

Third Modification Example

Figure 10A:
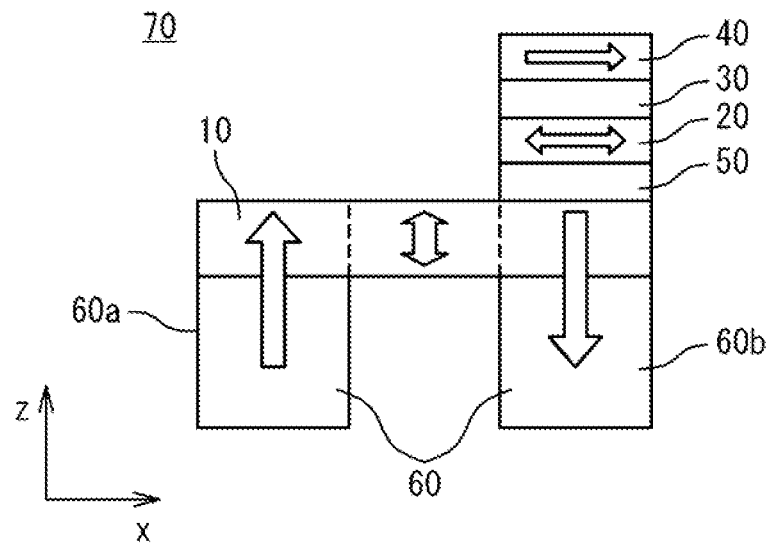
FIG. 10A is a schematic sectional view showing a configuration of a third modification example of a magnetic memory element according to the exemplary embodiment of the present invention.
Figure 10B:
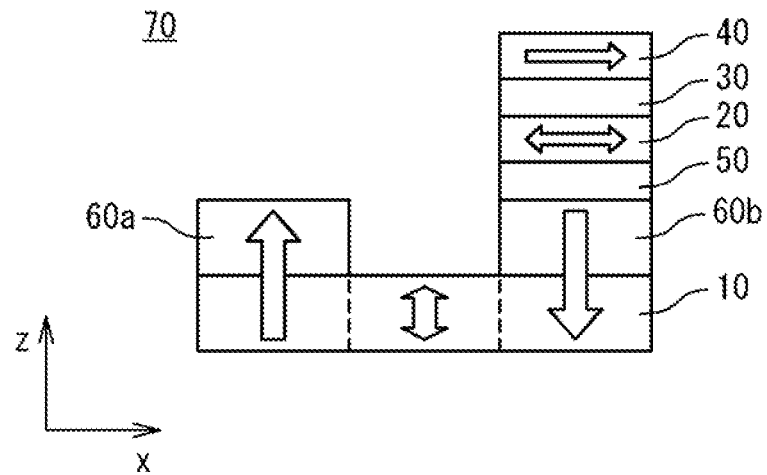
FIG. 10B is a schematic sectional view showing a configuration of a third modification example of a magnetic memory element according to the exemplary embodiment of the present invention.
Figure 10C:
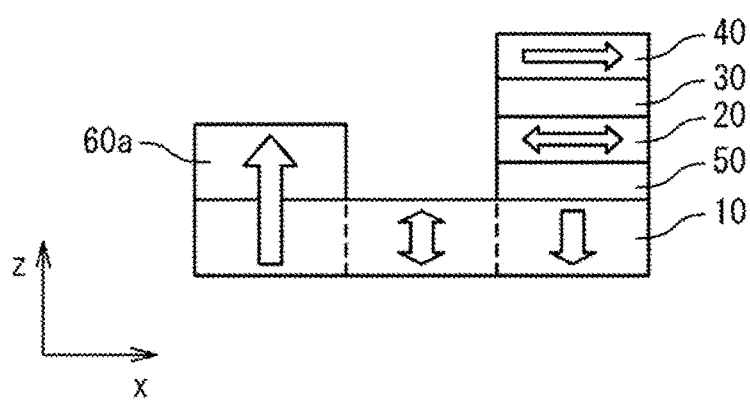
FIG. 10C is a schematic sectional view showing a configuration of a third modification example of a magnetic memory element according to the exemplary embodiment of the present invention.

FIGS. 10A to 10C are schematic sectional views showing a configuration of a third modification example of the magnetic memory element 70 according to the exemplary embodiment of the present invention. The third modification example relates to the positional relation between the magnetization fixed layer group 60 and the MTJ including the second magnetization free layer 20, the non-magnetic layer 30 and the reference layer 40.

In the present invention, the positional relation between the MTJ and the magnetization fixed layer group 60 is arbitrary. FIG. 10A shows one example. In FIG. 10A, the MTJ is provided above the first magnetization free layer 10, and the magnetization fixed layer group 60 is provided below the first magnetization free layer 10.

FIG. 10B shows another example. In FIG. 10B, the MTJ and the magnetization fixed layer group 60 are provided above the first magnetization free layer 10. In this case, it is preferable that the magnetization fixed layer group 60 is close to the first magnetization free layer 10 as compared with the MTJ. In the case of the configuration shown in FIG. 10B, since the distance between the second magnetization free layer 20 and the magnetization free region 12 is increased, the magnetostatic coupling caused by the leakage magnetic field described in FIGS. 2C and 2D is weakened. However, if the thickness of the magnetization fixed layer group 60 is not excessively thick, the magnetization of the second magnetization free layer 20 can respond to the magnetization direction of the magnetization free region 12 by the magnetic coupling. In addition, in the case of the configuration shown in FIG. 10B, by depositing the magnetization free layer 10, the magnetization fixed layer group 60, the conductive layer 50, the second magnetization free layer 20, the non-magnetic layer 30, and the reference layer 90 at one time and then carrying out the patterning, the magnetic memory element 70 can be formed. Therefore, the manufacturing process becomes easy.

FIG. 10C is another example. In FIG. 10C, even though the first magnetization fixed layer group 60a is provided adjacent to the first magnetization fixed region 11a, there is no magnetization fixed layer group 60 provided adjacent to the second magnetization fixed region 11b. The conductive layer 50, the second magnetization free layer 20, the non-magnetic layer 30 and the reference layer 40 are provided on the second magnetization fixed region 11b. In this case, since the distance between the second magnetization free layer 20 and the magnetization free region 12 can be reduced, the magnetostatic coupling caused by the leakage magnetic field between the second magnetization free layer 20 and the magnetization free region 12 can be strengthened. Here, it is necessary to discontinuously prepare one of the first magnetization fixed layer group 60a and the set of the conductive layer 50, the second magnetization free layer 20, the non-magnetic layer 30 and the reference layer 40. In the present exemplary embodiment, it may be possible to deposit and pattern the first magnetization fixed layer group 60a, and then deposit and pattern the conductive layer 50, the second magnetization free layer 20, the non-magnetic layer 30 and the reference layer 40. Alternatively, it may be possible to deposit and pattern the conductive layer 50, the second magnetization free layer 20, the non-magnetic layer 30 and the reference layer 40, and then deposit and pattern the first magnetization fixed layer group 60a.

Fourth Modification Example

Figure 11A:
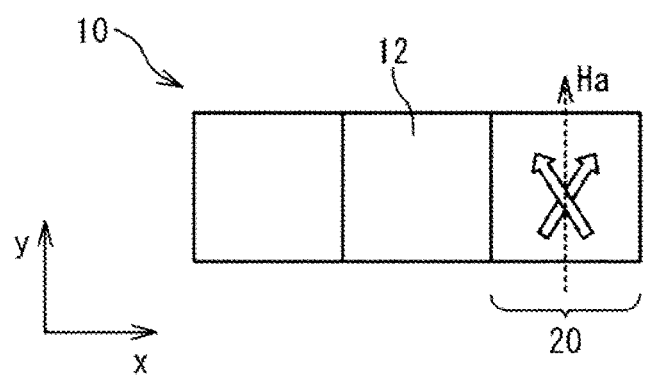
FIG. 11A is a schematic sectional view showing a configuration of a fourth modification example of a magnetic memory element according to the exemplary embodiment of the present invention.
Figure 11B:
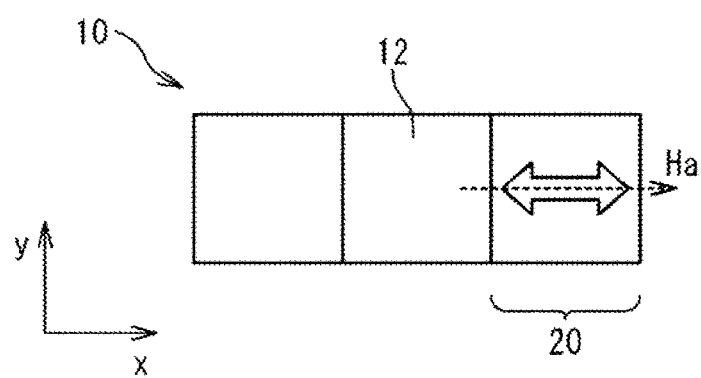
FIG. 11B is a schematic sectional view showing a configuration of a fourth modification example of a magnetic memory element according to the exemplary embodiment of the present invention.

FIGS. 11A and 11B are schematic sectional views showing a configuration of a fourth modification example of the magnetic memory element 70 according to the exemplary embodiment of the present invention. The fourth modification example relates to the direction of the magnetic anisotropy of the second magnetization free layer 20.

In the magnetic memory element 70, data is stored as the magnetization direction of the magnetization free region 12 in the first magnetization free layer 10. The data is read as the TMR ratio of the MTJ including the second magnetization free layer 20 which takes the magnetization direction reflecting the magnetization direction of the magnetization free region 12. In the case of a general MRAM, data is stored in a free layer, and the data is read as a TMR ratio caused by a relative angle between magnetization of the free layer and magnetization of a reference layer. Here, the present invention is characterized in that the general free layer is provided separately into the first magnetization free layer 10 as a free layer for writing and the second magnetization free layer 20 as a free layer for reading. It is only necessary to change the magnetization direction of the second magnetization free layer 20 based on the magnetization direction of the magnetization free region 12. The magnetization direction may be changed or unchanged 180 degrees based on the stored data ("0", "1"). Based on this standpoint, the direction of the magnetic anisotropy of the second magnetization free layer 20 is arbitrary.

FIG. 11A shows one example of the direction of the magnetic anisotropy of the second magnetization free layer 20. In FIG. 11A, the direction of the magnetic anisotropy of the second magnetization free layer 20 is the y direction. In this case, since the anisotropy magnetic field Ha is provided in the y direction, when the magnetization of the magnetization free region 12 is oriented in the +z direction or the −z direction, the magnetization of the second magnetization free layer 20 turns to the +x direction or the −x direction around the y axis. That is, the operation of the second magnetization free layer 20 is the hard axis operation. When the operation of the second magnetization free layer 20 is the hard axis operation, even if the leakage magnetic field caused by the magnetization free region 12 is small, the second magnetization free layer 20 can sensitively respond to the leakage magnetic field.

On the other hand, FIG. 11B shows another example of the direction of the magnetic anisotropy of the second magnetization free layer 20. In FIG. 11B, the direction of the magnetic anisotropy of the second magnetization free layer 20 is the x direction. That is, the anisotropy magnetic field Ha is provided in the x direction. In this case, when the magnetization of the magnetization free region 12 is oriented in the +z direction or the −z direction, the magnetization of the second magnetization free layer 20 is oriented in any of the +x direction and the −x direction. That is, the operation of the second magnetization free layer 20 is the easy axis operation. When the operation of the second magnetization free layer 20 is the easy axis operation, since the magnetization direction of the second magnetization free layer 20 is changed 180 degrees, the maximum TMR ratio obtainable from this MTJ can be obtained.

Incidentally, the magnetic anisotropy shown in FIGS. 11A and 11B may be given by the crystal magnetic anisotropy caused by the crystal structure, by the shape magnetic anisotropy caused by the shape, or by the stress induced magnetic anisotropy caused by the magnetic strain and stress. When the magnetic anisotropy is given by the stress induced magnetic anisotropy, the magnitude of the magnetic anisotropy can be controlled by materials and thicknesses of wiring lines arranged on the periphery.

Fifth Modification Example

Figure 12A:
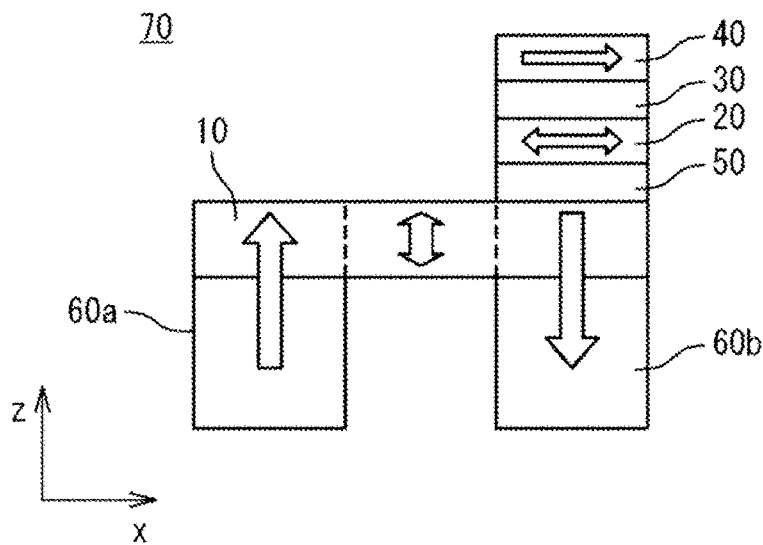
FIG. 12A is a schematic sectional view showing a configuration of a fifth modification example of a magnetic memory element according to the exemplary embodiment of the present invention.
Figure 12B:
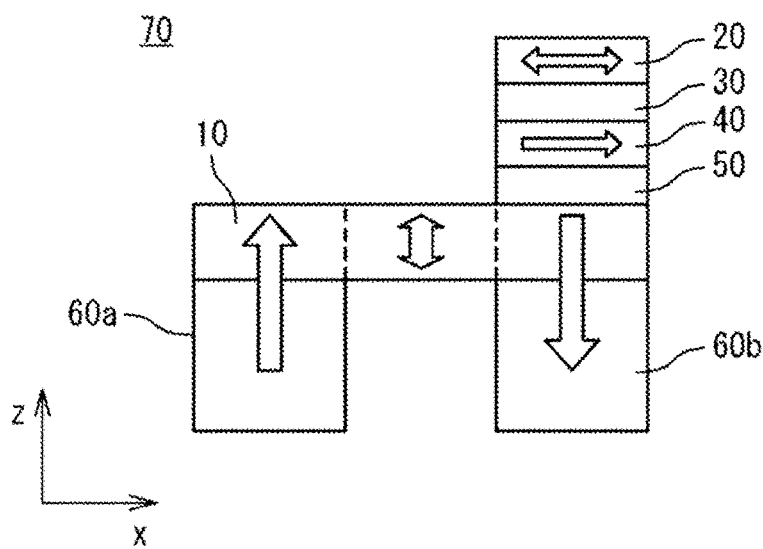
FIG. 12B is a schematic sectional view showing a configuration of a fifth modification example of a magnetic memory element according to the exemplary embodiment of the present invention.

FIGS. 12A and 12B are schematic sectional views showing a configuration of a fifth modification example of the magnetic memory element 70 according to the exemplary embodiment of the present invention. The fifth modification example relates to the lamination order of the second magnetization free layer 20, the non-magnetic layer 30 and the reference layer 40.

In the magnetic memory element 70, the MTJ including the second magnetization free layer 20, the non-magnetic layer 30 and the reference layer 40 is arbitrary within the case that the second magnetization free layer 20, the non-magnetic layer 30 and the reference layer 40 are laminated in this order. That is, for example, as shown in FIG. 12A, the second magnetization free layer 20 may be arranged at the side of the first magnetization free layer 10, or as shown in FIG. 12B, the reference layer 40 may be arranged at the side of the first magnetization free layer 10.

When the second magnetization free layer 20 is arranged at the side of the first magnetization free layer 10 as shown in FIG. 12A, since the distance between the second magnetization free layer 20 and the magnetization free region 12 is decreased, the magnetostatic coupling caused by the leakage magnetic field between the second magnetization free layer 20 and the magnetization free region 12 is strengthened. However, when the reference layer 40 is arranged at the side of the first magnetization free layer 10 as shown in FIG. 12B, the MTJ including the second magnetization free layer 20, the non-magnetic layer 30 and the reference layer 40 is a bottom pin structure. The bottom pin structure. Generally, the MTJ with the bottom pin structure can easily obtain the large TMR ratio as compared with the MTJ with the top pin structure shown in FIG. 12A.

Sixth Modification Example

Figure 13A:
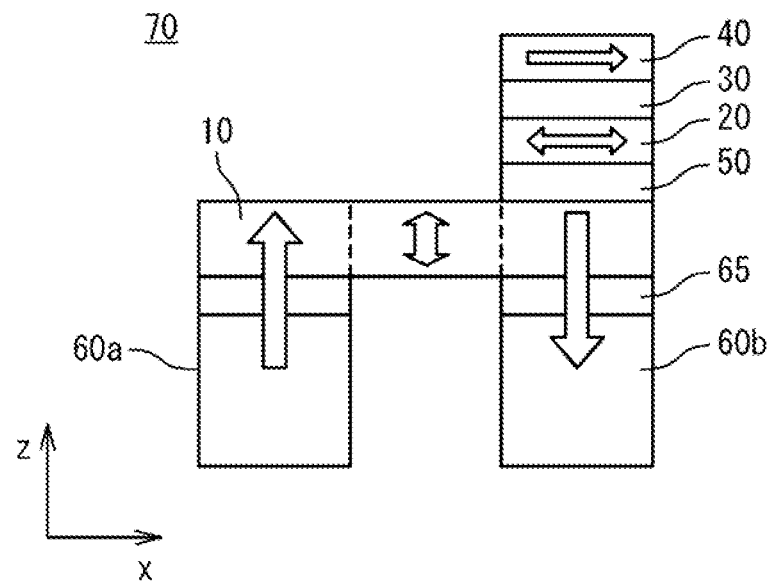
FIG. 13A is a schematic sectional view showing a configuration of a sixth modification example of a magnetic memory element according to the exemplary embodiment of the present invention.
Figure 13B:
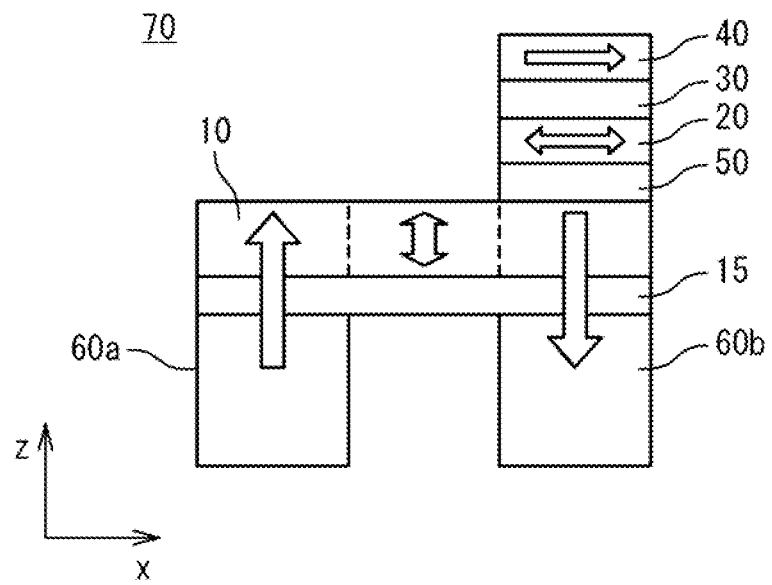
FIG. 13B is a schematic sectional view showing a configuration of a sixth modification example of a magnetic memory element according to the exemplary embodiment of the present invention.

FIGS. 13A and 13B are schematic sectional views showing a configuration of a sixth modification example of the magnetic memory element 70 according to the exemplary embodiment of the present invention. The sixth modification example relates to the positional relation between the first magnetization free layer 10 and the magnetization fixed layer group 60.

In the magnetic memory element 70, the magnetization fixed layer 60 is provided near the first magnetization free layer 10, the magnetization of the first magnetization fixed region 11a and the magnetization of the second magnetization fixed region 11b are anti-parallel to each other and fixed in the certain directions. Here, to achieve this object, the magnetization fixed layer group 60 may be provided non-adjacent to the first magnetization free layer 10 and another layer may be provided between the magnetization fixed layer group 60 and the first magnetization free layer 10. For example, as shown in FIG. 13A, a cap layer 65 may be provided adjacent to and above the magnetization fixed layer group 60. For example, as shown in FIG. 13B, a ground layer 15 may be provided adjacent to and below the first magnetization free layer 10.

As shown in FIG. 13A, by providing the cap layer 65 adjacent to and above the magnetization fixed layer group 60, the magnetization fixed layer group 60 can be protected from being damaged in the manufacturing process during the formation process of the magnetization fixed layer group 60. As shown in FIG. 13B, by providing the ground layer 15 adjacent to and below the first magnetization free layer 10, the crystal structure of the first magnetization free layer 10 can be adjusted so as to obtain desirable magnetic properties.

As application examples of the present invention, a semiconductor memory device used for a cell phone, a mobile personal computer and a PDA, and a microcomputer in which a nonvolatile memory is embedded used for a vehicle and the like are exemplified.

While the invention has been particularly shown and described with reference to exemplary embodiments thereof, the invention is not limited to these exemplary embodiments. It will be understood by those of ordinary skill in the art that various changes in form and details may be made therein without departing from the spirit and scope of the present invention as defined by the claims. The techniques described in the exemplary embodiments and the modified examples can be mutually applied to other exemplary embodiments and modified examples if technical inconsistencies do not occur.

This application is based upon and claims the benefit of priority from Japanese patent application No. 2009-020138 filed on Jan. 30, 2009, the disclosure of which is incorporated herein in its entirety by reference.

The invention claimed is:

1. A magnetic memory element comprising:
a first magnetization free layer configured to be formed of a ferromagnetic material having perpendicular magnetic anisotropy;
a second magnetization free layer configured to be provided near said first magnetization free layer and formed of a ferromagnetic material having in-plane magnetic anisotropy;
a reference layer configured to be formed of a ferromagnetic material having in-plane magnetic anisotropy; and
a non-magnetic layer configured to be provided between said second magnetization free layer and said reference layer,
wherein said first magnetization free layer includes:
a first magnetization fixed region of which magnetization is fixed,
a second magnetization fixed region of which magnetization is fixed, and a magnetization free region which is connected to said first magnetization fixed region and said second magnetization fixed region, and of which magnetization can be switched, wherein said first magnetization free layer has a first surface and said second magnetization free layer has a second surface, wherein a whole of said second surface is opposed to a portion less than a whole of said first surface, and wherein said second magnetization free layer is provided in a first direction away from said magnetization free region.

2. The magnetic memory element according to claim 1, wherein said reference layer has magnetization fixed in a direction approximately parallel to said first direction.

3. The magnetic memory element according to claim 1, wherein said second magnetization free layer is included in one of said first magnetization fixed region and said second magnetization fixed region.

4. The magnetic memory element according to claim 3, wherein said first magnetization fixed region, said magnetization free region and said second magnetization fixed region are arranged linearly in this order, and wherein said first magnetization free layer has a rectangle shape with an aspect ratio of approximately three.

5. The magnetic memory element according to claim 3, further comprising:

a magnetization fixed layer group configured to be magnetically coupled with said first magnetization free layer.

6. The magnetic memory element according to claim 3, further comprising:

a conductive layer configured to be electrically connected to said first magnetization free layer and one of said second magnetization free layer and said reference layer.

7. The magnetic memory element according to claim 5, wherein said second magnetization free layer and said magnetization fixed layer group are arranged in places opposite to each other with respect said first magnetization free layer.

8. The magnetic memory element according to claim 5, wherein said second magnetization free layer and said magnetization fixed layer group are arranged in the same side with respect said first magnetization free layer.

9. A magnetic memory comprising:

a plurality of magnetic memory cells configured to be arranged in a matrix shape, each of plurality of magnetic memory cells including a magnetic memory element, wherein said magnetic memory element comprising:

a first magnetization free layer configured to be formed of a ferromagnetic material having perpendicular magnetic anisotropy;

a second magnetization free layer configured to be provided near said first magnetization free layer and formed of a ferromagnetic material having in-plane magnetic anisotropy;

a reference layer configured to be formed of a ferromagnetic material having in-plane magnetic anisotropy; and a non-magnetic layer configured to be provided between said second magnetization free layer and said reference layer, wherein said first magnetization free layer includes:

a first magnetization fixed region of which magnetization is fixed, a second magnetization fixed region of which magnetization is fixed, and a magnetization free region which is connected to said first magnetization fixed region and said second magnetization fixed region, and of which magnetization can be switched, wherein said first magnetization free layer has a first surface and said second magnetization free layer has a second surface, wherein a whole of said second surface is opposed to a portion less than a whole of said first surface, and wherein said second magnetization free layer is provided in a first direction away from said magnetization free region.

10. The magnetic memory according to claim 9, wherein said reference layer has magnetization fixed in a direction approximately parallel to said first direction.

11. The magnetic memory according to claim 9, wherein said second magnetization free layer is included in one of said first magnetization fixed region and said second magnetization fixed region.

12. The magnetic memory according to claim 11, wherein said first magnetization fixed region, said magnetization free region and said second magnetization fixed region are arranged linearly in this order, and wherein said first magnetization free layer has a rectangle shape with an aspect ratio of approximately three.

13. The magnetic memory according to claim 11, wherein said magnetic memory element further includes:

a magnetization fixed layer group configured to be magnetically coupled with said first magnetization free layer.

14. The magnetic memory according to claim 11, wherein said magnetic memory element further includes:

a conductive layer configured to be electrically connected to said first magnetization free layer and one of said second magnetization free layer and said reference layer.

15. The magnetic memory according to claim 13, wherein said second magnetization free layer and said magnetization fixed layer group are arranged in places opposite to each other with respect said first magnetization free layer.

16. The magnetic memory according to claim 13, wherein said second magnetization free layer and said magnetization fixed layer group are arranged in the same side with respect said first magnetization free layer.

* * * * *